United States Patent
Lin et al.

(10) Patent No.: US 10,665,473 B2
(45) Date of Patent: May 26, 2020

(54) PACKAGE STRUCTURE AND METHOD OF FABRICATING THE SAME

(71) Applicant: Taiwan Semiconductor Manufacturing Co., Ltd., Hsinchu (TW)

(72) Inventors: Chia-Hsiang Lin, Hsinchu County (TW); Feng-Cheng Hsu, New Taipei (TW); Shuo-Mao Chen, New Taipei (TW); Shin-Puu Jeng, Hsinchu (TW); Arunima Banerjee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/806,338

(22) Filed: Nov. 8, 2017

(65) Prior Publication Data

US 2019/0139784 A1 May 9, 2019

(51) Int. Cl.
*H01L 21/48* (2006.01)
*H01L 23/498* (2006.01)
(Continued)

(52) U.S. Cl.
CPC ........ *H01L 21/4853* (2013.01); *H01L 21/481* (2013.01); *H01L 21/4846* (2013.01); *H01L 21/4857* (2013.01); *H01L 21/6835* (2013.01); *H01L 23/49816* (2013.01); *H01L 23/49822* (2013.01); *H01L 23/49838* (2013.01); *H01L 24/03* (2013.01); *H01L 24/05* (2013.01); *H01L 24/11* (2013.01); *H01L 24/13* (2013.01); *H01L 23/3128* (2013.01); *H01L 23/49866* (2013.01); *H01L 24/16* (2013.01); *H01L 24/32* (2013.01); *H01L 24/73* (2013.01); *H01L 25/0652* (2013.01); *H01L 25/105* (2013.01); *H01L 2221/68359* (2013.01); *H01L 2224/0401* (2013.01); *H01L 2224/13111* (2013.01); *H01L 2224/13139* (2013.01); *H01L 2224/13144* (2013.01); *H01L 2224/13147* (2013.01); *H01L 2224/16227* (2013.01); *H01L 2224/32225* (2013.01); *H01L 2224/73204* (2013.01); *H01L 2224/73259* (2013.01); *H01L 2225/06517* (2013.01); *H01L 2225/06572* (2013.01);
(Continued)

(58) Field of Classification Search
CPC . H01L 2224/05557; H01L 2224/13018; H01L 2224/0555–05559; H01L 21/4853; H01L 21/4846; H01L 23/49838
See application file for complete search history.

(56) References Cited

U.S. PATENT DOCUMENTS

2010/0044863 A1* 2/2010 Kasai .................. H01L 23/3114
257/738
2015/0294949 A1* 10/2015 Lin .................... H01L 23/49816
257/738

(Continued)

*Primary Examiner* — Zandra V Smith
*Assistant Examiner* — Evan G Clinton
(74) *Attorney, Agent, or Firm* — JCIPRNET

(57) ABSTRACT

A package structure including a semiconductor die, a redistribution layer and a plurality of conductive elements is provided. At least one joint of the joints in the redistribution layer or on the semiconductor die is connected with the conductive element for electrically connecting the redistribution layer, the semiconductor die and the conductive elements.

14 Claims, 28 Drawing Sheets

(51) Int. Cl.
*H01L 23/00* (2006.01)
*H01L 21/683* (2006.01)
*H01L 25/10* (2006.01)
*H01L 23/31* (2006.01)
*H01L 25/065* (2006.01)

(52) U.S. Cl.
CPC ........... *H01L 2225/1023* (2013.01); *H01L 2225/1035* (2013.01); *H01L 2225/1058* (2013.01); *H01L 2924/15192* (2013.01); *H01L 2924/15311* (2013.01); *H01L 2924/181* (2013.01); *H01L 2924/18161* (2013.01)

(56) References Cited

U.S. PATENT DOCUMENTS

2016/0064341 A1* 3/2016 Yap .................... H01L 24/03
257/779
2017/0365566 A1* 12/2017 Lee .................... H01L 23/3114

\* cited by examiner

PACKAGE STRUCTURE AND METHOD OF FABRICATING THE SAME

BACKGROUND

Modern electronic packages need reliable interconnections between chip-to-package and chip-to-substrate and require advanced processes and materials.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
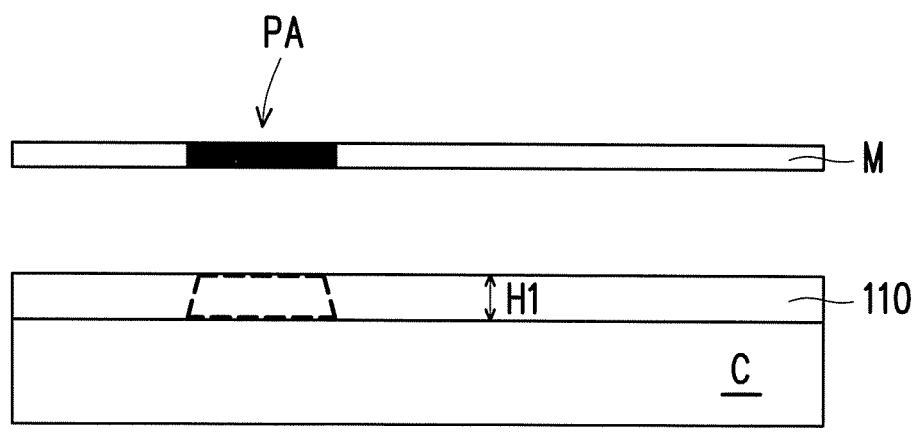
FIG. 1A to FIG. 1F are schematic cross sectional views of various stages in a manufacturing method of a connection structure according to some exemplary embodiments of the disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1F are schematic cross sectional views of various stages in a manufacturing method of a connection structure according to some exemplary embodiments of the disclosure. As shown in FIG. 1A, a carrier C is provided with a first dielectric layer 110 formed thereon. In some embodiments, the carrier C is a semiconductor carrier or a glass substrate. In some embodiments, the first dielectric layer 110 may be formed by coating, printing or deposition, such as chemical vapor deposition, with a thickness H1. In some embodiments, the thickness H1 is about 1~20 microns or about 7~9 microns. In some embodiments, the first dielectric layer 110 may be a photosensitive polymeric material layer, made of a positive-type photosensitive polymeric material, for example. In some embodiments, the polymeric material may include polyimide, benzocyclobutene (BCB), polybenzoxazole (PBO) or any other suitable polymer materials, for example. In some embodiments, the carrier further has a debond layer (not shown) formed on its surface and the debond layer between the carrier C and the first dielectric layer 110 may be a light-to-heat conversion (LTHC) release layer.

In the exemplary embodiment, as shown in FIG. 1A, a light exposure process is performed to the first dielectric layer 110 using a mask M with a pattern PA. In some embodiments, a portion of the first dielectric layer 110 under the pattern PA is shielded from the exposure (as shown encircled by the dotted line). In some embodiments, the first dielectric layer 110 is partially exposed to light.

Figure 1B:
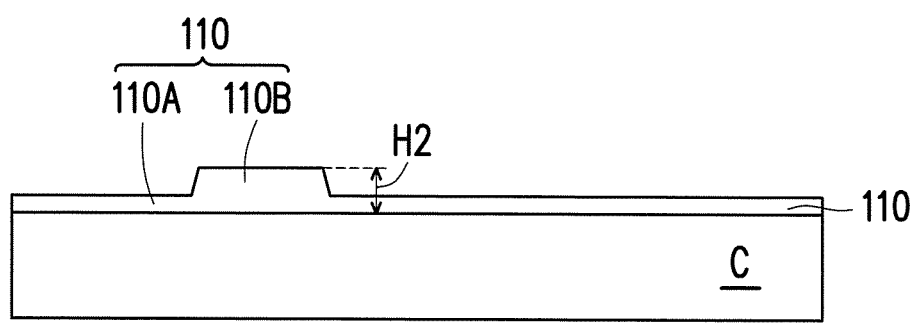

In FIG. 1B, in some embodiments, a development process is performed and the portions of the first dielectric layer 110 exposed to light are removed. Optionally, a curing process may be performed after the development process. In some embodiments, the portion 110A of the first dielectric layer 110 not shielded by the pattern PA is mostly removed, though not completely removed, with a small thickness remained (about 0.25~0.35 H1). In some embodiments, the block portion 110B of the first dielectric layer 110 shielded by the pattern PA is mostly remained with a thickness H2. In some embodiments, the thickness H2 is about 1~12 microns (about 0.6~0.7 H1) or about 5 microns. That is, the portion 110B is protruded from the surface of the portion 110A with a height of about 2~3 microns or about 2.5 microns. In some embodiments, the pattern of the protruded portion 110B corresponds to the pattern PA (FIG. 1A). In some embodiments, the pattern of the portion 110B may include round or tetragonal blocks as dummy pad patterns.

Figure 1C:
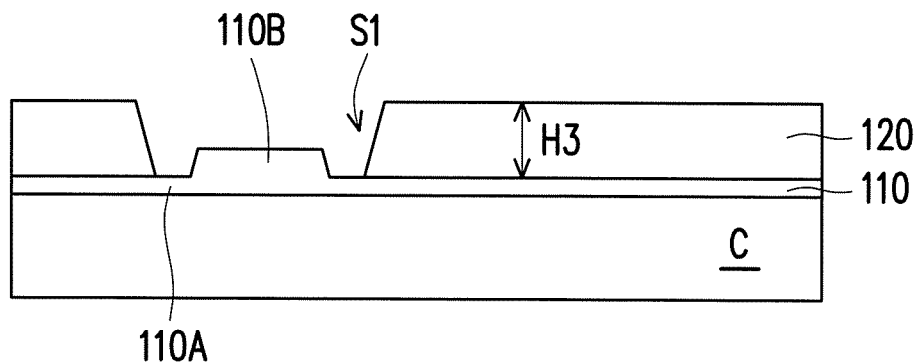

In the exemplary embodiment, as shown in FIG. 1C, a second dielectric layer 120 having one or more openings S1 is formed over the first dielectric layer 110. In some embodiments, the opening S1 is a through hole for defining the locations and shapes of the subsequently formed joints, via or pad. In some embodiments, the second dielectric layer 120 may be formed by coating, printing or deposition, such as chemical vapor deposition, with a thickness H3. In some embodiments, the thickness H3 is about 1~20 microns or about 8~10 microns. In some embodiments, the second dielectric layer 120 may be a polymeric material layer. In some embodiments, the polymeric material may include polyimide, benzocyclobutene (BCB), polybenzoxazole (PBO) or any other suitable polymer materials, for example. In some embodiments, the patterned second dielectric layer 120 covers the first dielectric layer 110 but exposes at least the protruded portion 110B of the first dielectric layer 110. In some embodiments, the opening S1 exposes the protruded portion 110B of the first dielectric layer 110 and a part of the portion 110A surrounding the protruded portion 110B. That is, the size of the opening S1 is larger than the protruded portion 110B. In some embodiments, the shape of the opening S1 may correspond to or resemble with the shape of the dummy pad patterns of the protruded portion 110B. In some embodiments, the shape of the opening S1 may differ from the shape of the dummy pad patterns of the protruded portion 110B.

Figure 1D:
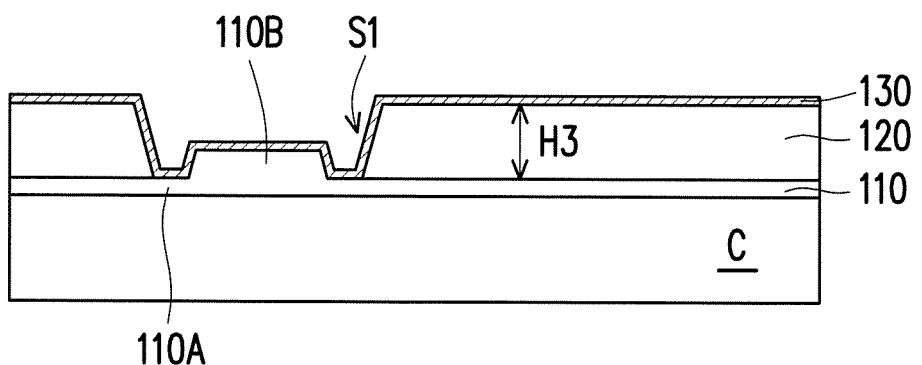

In some embodiments, as shown in FIG. 1D, a seed layer 130 is formed over the second dielectric layer 120 covering the opening(s) S1 and the underlying first dielectric layer 110 exposed by the opening(s) S1. In some embodiments, the seed layer 130 is formed covering the second dielectric layer 120 and conformally covering the opening(s) S1 and the underlying first dielectric layer 110 exposed by the opening(s) S1. That is, the seed layer 130 at least covers the sidewalls of the opening S1, a top surface and sidewalls of the protruded portion 110B and a top surface of the part of the portion 110A exposed by the opening S1 (i.e. the seed layer being conformal to the profiles of the opening S1 and the protruded portion 110B). That is, the seed layer 130 is in direct contact with the protruded portion 110B and a part of the portion 110A within the opening(s) S1. In some embodiments, the seed layer 130 is formed by sputtering. In some embodiments, the material of the seed layer 130 may include titanium, tungsten, copper, gold, alloys and/or combinations thereof. In some embodiments, the seed layer 130 includes titanium, copper and/or tungsten.

Figure 1E:
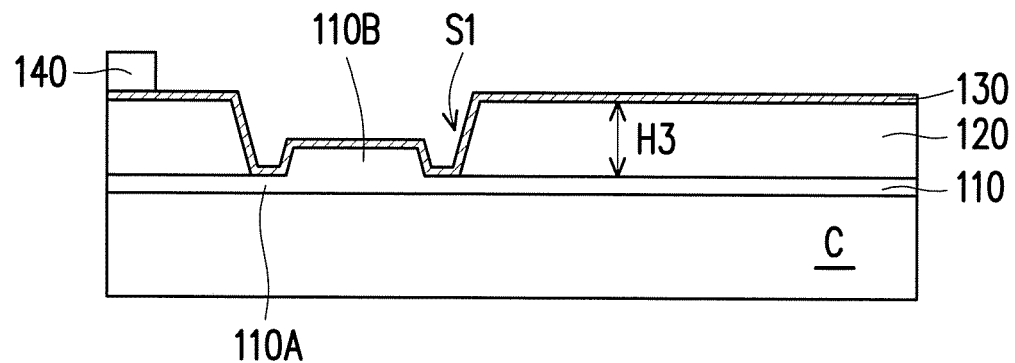

In some embodiments, in FIG. 1E, a masking layer 140 is formed over the seed layer, partially covering the seed layer 130 without covering at least the seed layer 130 over the opening(s) S1. In some embodiments, the masking layer 140 exposes portions of the seed layer 130 on second dielectric layer 120.

Figure 1F:
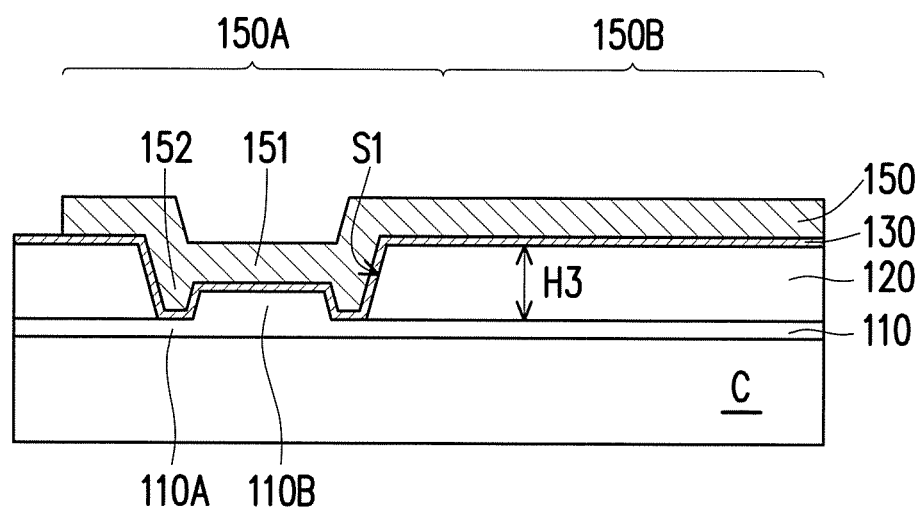

In some embodiments, in FIG. 1F, a metallic pattern 150 is formed on the exposed seed layer 130 over the second dielectric layer 120, filling up the opening(s) S1 (see FIG. 1E). In some embodiments, the metallic pattern 150 is formed on the seed layer 130 that is not covered by the masking layer 140, and the masking layer 140 is removed. In some embodiments, the metallic pattern 150 may be formed by plating or deposition. In some embodiments, a material of the metallic pattern 150 includes, for example, copper, nickel, tungsten, titanium, silver, aluminum, gold and/or alloys thereof. In certain embodiments, the metallic pattern 150 includes copper or copper alloys. In some embodiments, the formation of the metallic pattern 150 includes forming a metallic material layer (not shown) over the second dielectric layer 120 and over the seed layer 130 not cover by the masking layer 140 as well as filling up the opening S1 by plating. In some embodiments, after stripping off the masking layer 140, the seed layer 130 under the masking layer 140 (i.e. not covered by the metallic material layer) is then removed by wet etching. That is, the metallic pattern 150 is located on the seed layer 130 and over the second dielectric layer 120, and the metallic pattern 150 fills up the opening(s) S1. In some embodiments, the remained seed layer 130 is sandwiched between the metallic pattern 150 and the second dielectric layer 120 outside the opening S1 and sandwiched between the metallic pattern 150 and the first dielectric layer 110 within the opening S1. In some embodiments, the metallic pattern 150 includes joints 150A and routing traces 150B. In some embodiments, when the metallic pattern 150 is formed as an inter-layered redistribution pattern within a redistribution layer, the joint 150A may function as a via. In some embodiments, when the metallic pattern 150 is formed as an outermost redistribution pattern of a redistribution layer, the joint 150A may function as a pad. In some embodiments, within the opening S1, the joint 150A of the metallic pattern 150 includes a pad portion 151 located within the opening S1 and located above the protruded portion 110B and a ridge portion 152 around the pad portion 151 and located above the part of the portion 110A surrounding the protruded portion 110B. In some embodiments, within the opening S1, the remained seed layer 130 is sandwiched between the protruded portion 110B and the metallic pattern 150 as well as sandwiched between the sidewalls of the opening S1 and the metallic pattern 150. In some embodiments, due to the existence of the protruded portion 110B, the height difference or the depth of the opening S1 at the center or middle position may be decreased, thus assisting the filling of the metallic pattern into the opening S1 and improving the plating uniformity filling the via opening. In some embodiments, due to the existence of the protruded portion, a flatter or evener plane of the pad or via may be provided for the subsequently layers formed thereon.

In some embodiments, the processes depicted in FIGS. 1A-1F are compatible with the manufacturing processes for forming the redistribution structure or redistribution layer over the reconstructed wafer or the package. In some embodiments, the processes depicted in FIGS. 1A-1F may be part of a wafer level packaging process, and the above processes may be performed repeatedly for more than one time to form a redistribution structure for a package structure.

Figure 2A:
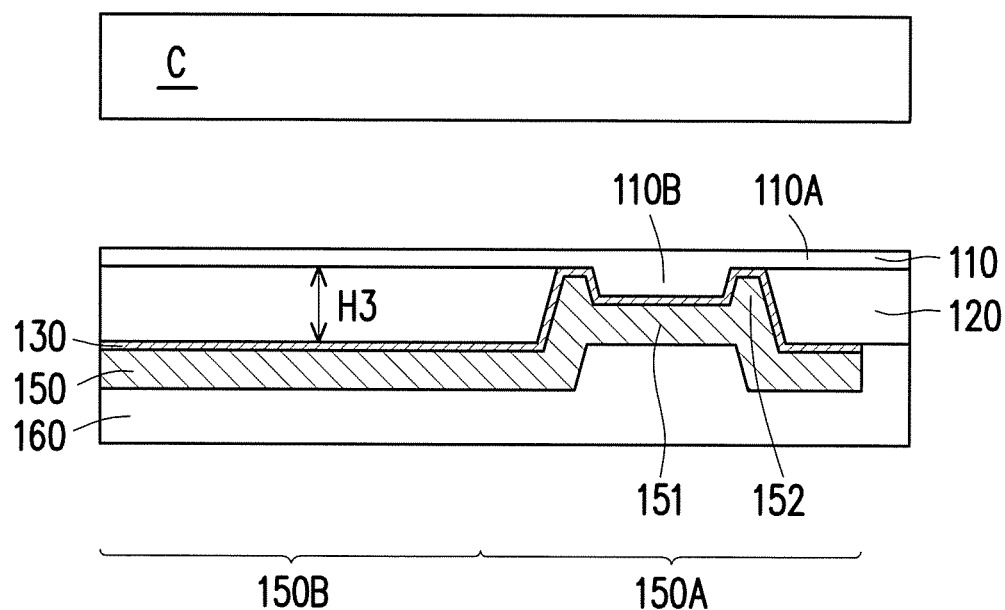
FIG. 2A to FIG. 2C are schematic cross sectional views of various stages in a manufacturing method of a connection structure in a package structure according to some exemplary embodiments of the disclosure.
Figure 2B:
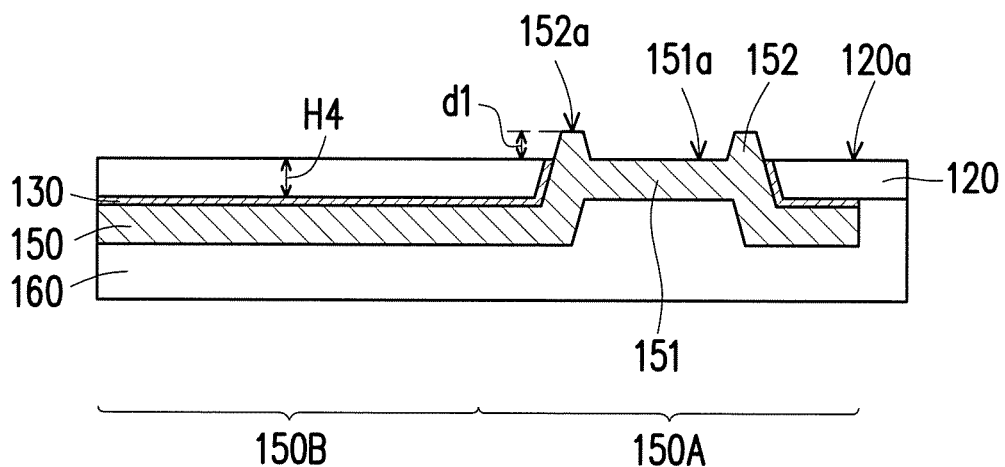
Figure 2C:
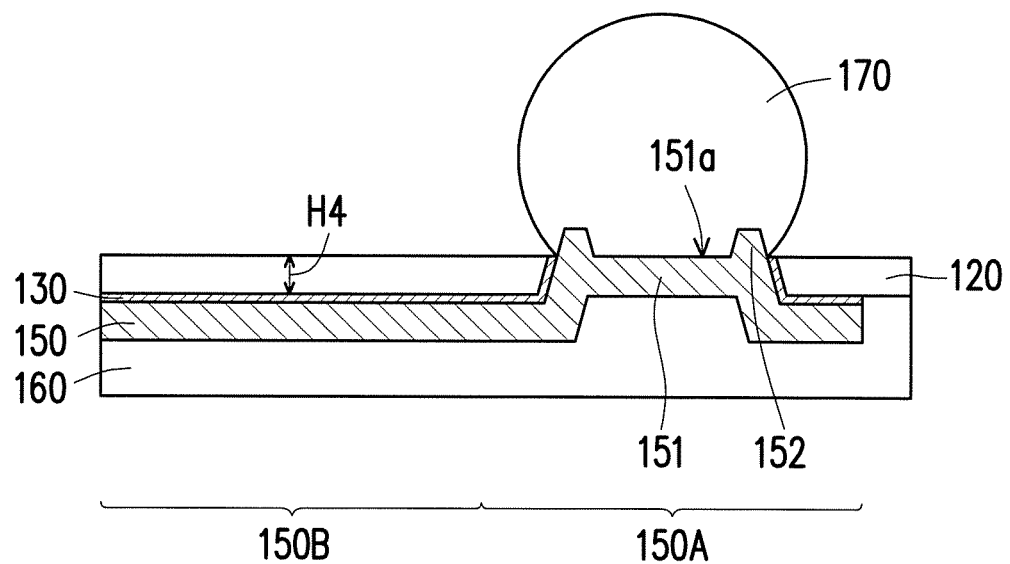

FIG. 2A to FIG. 2C are schematic cross sectional views of various stages in a manufacturing method of a connection structure in a package structure according to some exemplary embodiments of the disclosure. Following the processes depicted in FIGS. 1A-1F, a passivation layer 160 is formed over the whole structure covering the metallic pattern 150 and the first dielectric layer 110 and the second dielectric layer 120. Then, the whole structure is flip and turned upside down. As shown in FIG. 2A, the carrier C is separated from the first dielectric layer 110 and then removed. In FIG. 2B, the first dielectric layer 110 is removed and the seed layer 130 is also removed until the pad portion 151 is exposed. In some embodiments, the first dielectric layer 110 is fully removed through the first etching process, and the seed layer 130 and the second dielectric layer 120 are partially removed through the second etching process. In some embodiments, the seed layer 130 and the second dielectric layer 120 are etched until the top surface 151a of the pad portion 151 of the metallic pattern 150 is fully exposed. In some embodiments, the second dielectric layer 120 is partially removed and the remained second dielectric layer 120 has a height H4 of about 4~6 microns or about 5 microns. As shown in FIG. 2B, the ridge portion 152 of the metallic pattern 150 is exposed from the second dielectric layer 120 without the seed layer 130 being remained thereon, and the ridge portion 152 is protruded out from the surface 120a of the remained second dielectric layer 120 with a height d1 of about 2~3 microns or about 2.5 microns. That is, the top surface 151a of the pad portion 151 is levelled with the surface 120a of the remained second dielectric layer 120, and the top surface 152a of the ridge portion 152 is higher than the top surface 151a of the pad portion 151 with the height difference d1. In some embodiments, the ridge portion 152 is surrounded by the remained seed layer 130 and the second dielectric layer 120. In some embodiments, the remained seed layer 130 is sandwiched between the remained second dielectric layer 120 and the metallic pattern 150, except for the ridge portion 152 protruded out of the second dielectric layer 120.

Figure 2D:
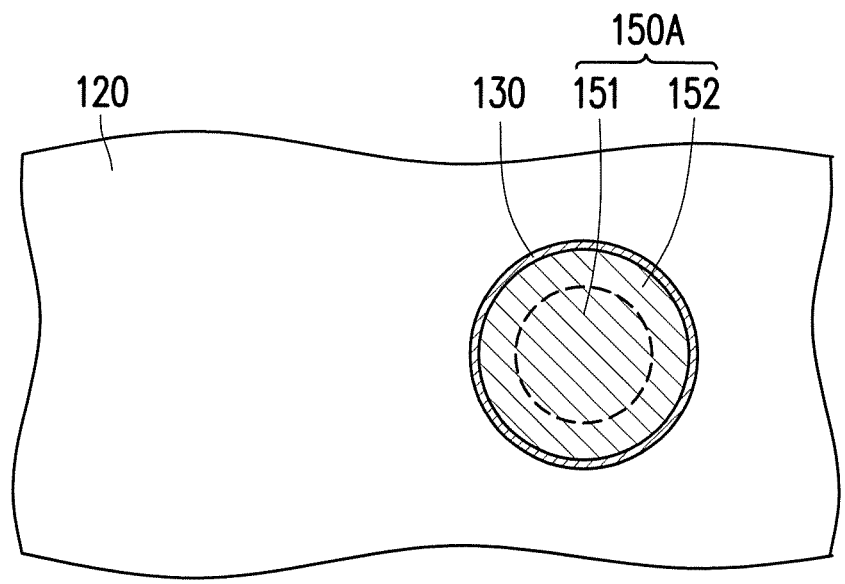
FIG. 2D is a schematic enlarged top view showing a portion of the structure depicted in FIG. 2B.

FIG. 2D is a schematic enlarged top view showing a portion of the structure depicted in FIG. 2B. In FIG. 2D, the joint 150A is depicted as a round pad as an example, the ridge portion 152 and the seed layer 130 surrounding the round pad portion 151 are shown in round ring shapes and arranged concentrically. However, it is understood the shape(s) and the relative arrangements are not limited by the examples disclosed herein, and other shapes such as tetragonal or polygonal shapes may be applicable.

In FIG. 2C, one or more conductive balls 170 are disposed on the metallic pattern 150. In some embodiments, the conductive ball 170 may be disposed on the joint 150A through a ball placement process. Although only one conductive ball 170 is shown herein, the number of the conductive ball(s) is usually more than one. In some embodiments, as shown in FIG. 2C, the conductive ball 170 is located directly on the ridge portion 152 and directly contacts the top surface 151a of the pad portion 151. That is, the pad portion 151 and the ridge portion 152 may function as the ball pad. Additionally, a reflow process or a heating process may be performed. In some embodiments, the conductive ball 170 is attached to the metallic pattern 150 and is electrically connected with the metallic pattern 150. In some embodiments, the conductive balls may be solder balls or ball grid array (BGA) balls, and the material of the conductive balls includes Sn-based solder materials, lead-free solder materials, and/or noble metal alloys including silver and gold. In one embodiment, the conductive ball 170 located on the ridge portion 152 of the joint 150A is in direct contact with the seed layer 130. In alternative embodiments, the conductive ball 170 located on the ridge portion 152 of the joint 150A is not in direct contact with the seed layer 130.

In the previous embodiment, the joint 150A together with the conductive ball 170 described herein may be considered as a connection structure for connecting dies or packages.

Figure 3A:
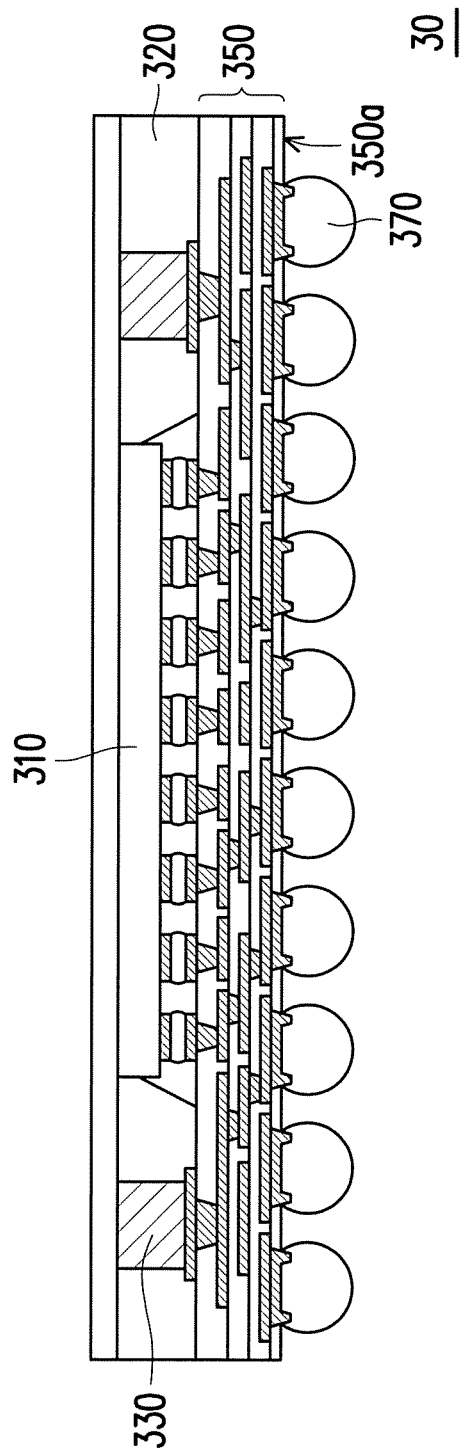
FIG. 3A is a schematic cross sectional view of an exemplary package structure according to some exemplary embodiments of the disclosure.
Figure 3B:
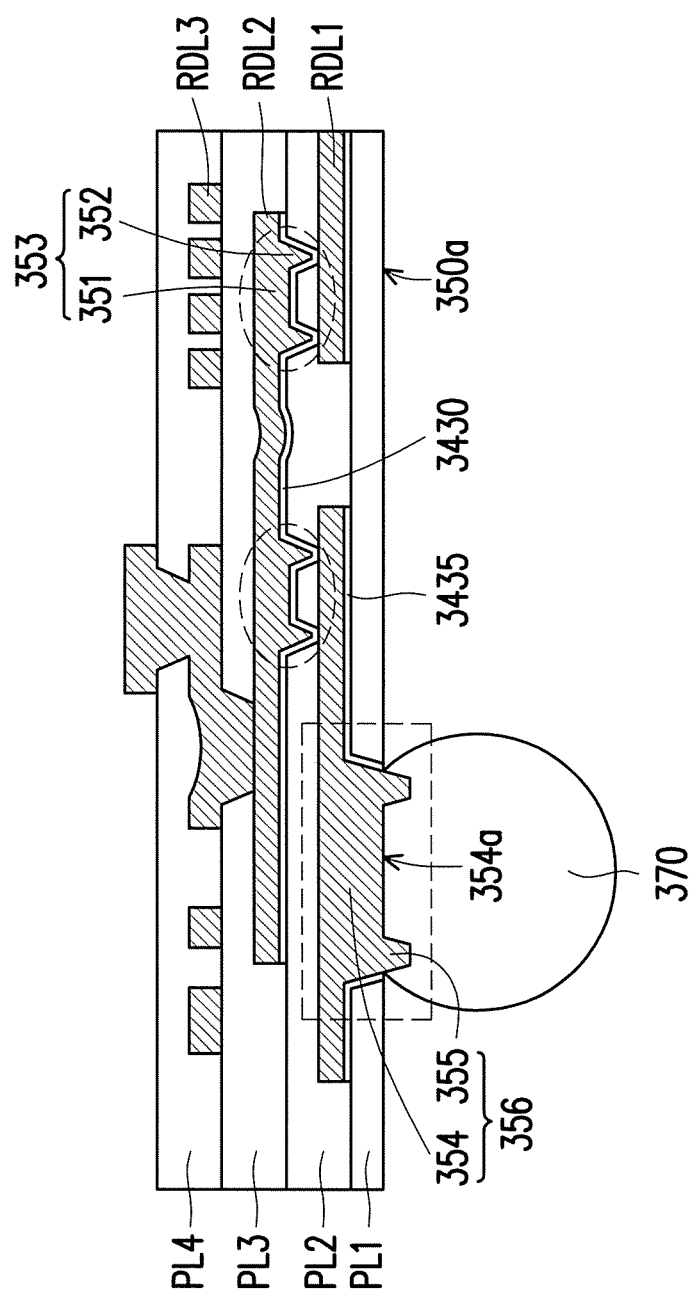
FIG. 3B is a schematic cross sectional enlarged view of a portion of an exemplary package structure according to some exemplary embodiments of the disclosure.

FIG. 3A is a schematic cross sectional view of an exemplary package structure according to some exemplary embodiments of the disclosure. FIG. 3B is a schematic cross sectional enlarged view of a portion of an exemplary package structure according to some exemplary embodiments of the disclosure. In FIG. 3A, the package structure 30 includes at least one die 310 molded in a molding compound 320 and a plurality of through molding vias 330 penetrating through the molding compound 320. In some embodiments, the package structure 30 includes a plurality of conductive balls 370 and a redistribution layer 350 located on the molding compound 320 and between the molding compound 320 and the conductive balls 370. The redistribution layer 350 is electrically connected with the die 310, and some or all of the conductive balls 370 are electrically connected with the die 310. In FIG. 3B, the redistribution layer 350 includes a first redistribution metallic pattern RDL1, a second redistribution metallic pattern RDL2 and a third redistribution metallic pattern RDL3 sandwiched between stacked dielectric layers PL1, PL2, PL3, PL4. As described in the previous embodiments, the processes depicted in FIGS. 1A-1F may be applicable for forming the RDL2. As described in previous embodiments, due to the existence of the protruded portion 110B, the unevenness or height difference at the locations of large or deep vias may be alleviated. By doing so, the subsequently formed RDL3 having fine pitch routing pattern(s) may be formed on a flatter or less uneven plane, thus improving the reliability of the RDL3 and the redistribution layer. As shown in FIG. 3B, the joints 353 (encircled by round dotted-line circles) of the RDL2 may function as vias and the joint 353 includes a pad portion 351 and a ridge portion 352 surrounding the pad portion 351. In certain embodiments, the pad portion 351 and the ridge portion 352 are of the same material. In FIG. 3B, the seed layer 3430 is sandwiched between the pad portions 351 and the dummy pad patterns, and the ridge portion 352 is connected with the underlying RDL1 with the seed layer 3430 located in-between. Also, in some embodiments, RDL1 having the joint 356 may be formed following the processes depicted in FIGS. 1A-1F and 2A-2C for forming the joint 150A. In some embodiments, in FIG. 3A and FIG. 3B, the conductive balls 370 are disposed on the bottom surface 350a of the redistribution layer 350. In certain embodiments, the joint 356 (encircled by rectangular dotted-line circle) of the RDL1 for receiving the conductive ball 370 functions as the pad or ball pad, and the conductive ball 370 is in direct contact with the bottom surface 354a of the pad portion 354 of the joint 356 without the seed layer 3435 in-between. In some embodiments, the ridge portion 355 protrudes out of the surface 350a (the bottom surface of the bottommost dielectric layer PL1) of the redistribution layer 350, and the conductive ball 370 seats on the ridge portion 355 of the joint 356.

Figure 4A:
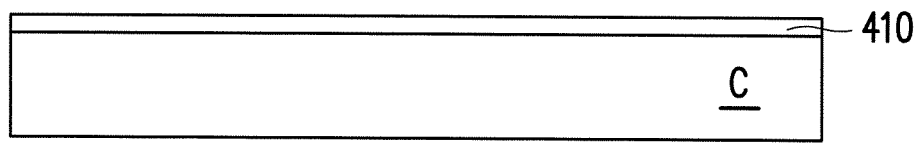
FIG. 4A to FIG. 4H are schematic cross sectional views of various stages in a manufacturing method of a connection structure according to some exemplary embodiments of the disclosure.

FIG. 4A to FIG. 4H are schematic cross sectional views of various stages in a manufacturing method of a connection structure according to some exemplary embodiments of the disclosure. As shown in FIG. 4A, a carrier C is provided with a first dielectric layer 410 formed thereon. In some embodiments, the carrier C further has a debond layer (not shown)

formed on its surface. In some embodiments, the first dielectric layer 410 may be formed by coating, printing or deposition, with a thickness of about 2~3 microns or about 2.5 microns. In some embodiments, the first dielectric layer 410 may be a polymeric material layer. In some embodiments, the polymeric material may include polyimide, benzocyclobutene (BCB), polybenzoxazole (PBO) or any other suitable polymer materials, for example.

Figure 4B:
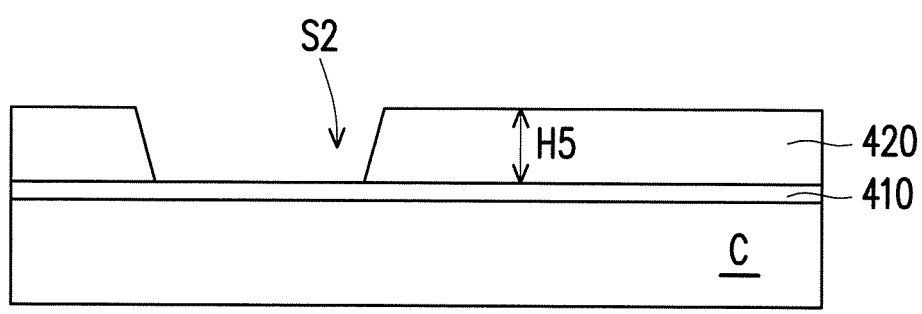

In FIG. 4B, in some embodiments, a second dielectric layer 420 having one or more openings S2 is formed over the first dielectric layer 410. In some embodiments, the opening S2 exposes a portion of the first dielectric layer 410. In some embodiments, the second dielectric layer may be formed by coating, printing or deposition, with a thickness H5. In some embodiments, the thickness H5 is about 1~20 microns or about 8~10 microns. In some embodiments, the second dielectric layer 420 may be a photosensitive polymeric material layer, made of a positive-type photosensitive polymeric material, for example. In some embodiments, the polymeric material may include polyimide, benzocyclobutene (BCB), polybenzoxazole (PBO) or any other suitable polymer materials, for example. In some embodiments, the opening S2 is a through hole for defining the locations and shapes of the subsequently formed joints, via or pad. In the exemplary embodiment, the second dielectric layer 420 may be formed by coating and then patterned through the exposure and development processes as described above, and further details will not be repeated herein.

Figure 4C:
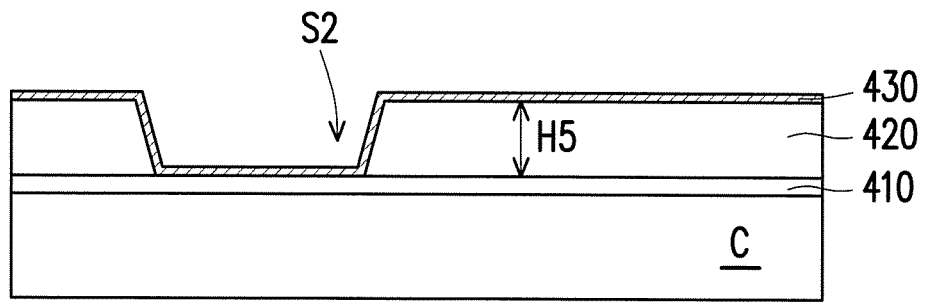

In the exemplary embodiment, as shown in FIG. 4C, a seed layer 430 is formed over the second dielectric layer 420 covering the opening(s) S2 and the underlying first dielectric layer 410 exposed by the opening(s) S2. In some embodiments, the seed layer 430 is formed covering the second dielectric layer 420 and conformally covering the opening(s) S2 and the underlying first dielectric layer 410 exposed by the opening(s) S2. That is, the seed layer 430 at least covers the sidewalls and a bottom of the opening S2 (i.e. the top surface of the first dielectric layer 410 exposed by the opening S2). In some embodiments, the seed layer 430 is formed by sputtering. In some embodiments, the material of the seed layer 430 may include titanium, tungsten, copper, gold, alloys and/or combinations thereof. In some embodiments, the seed layer 430 includes titanium, copper and/or tungsten.

Figure 4D:
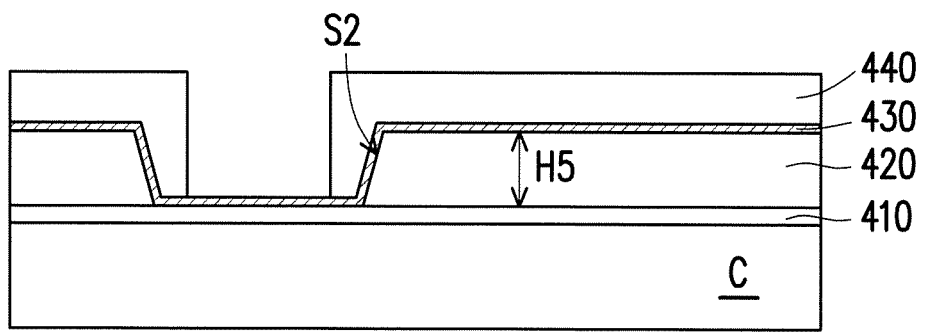

In some embodiments, in FIG. 4D, a masking layer 440 is formed over the seed layer 430 covering the seed layer 430 except for exposing a portion of the seed layer 430 located on the bottom of the opening(s) S2.

Figure 4E:
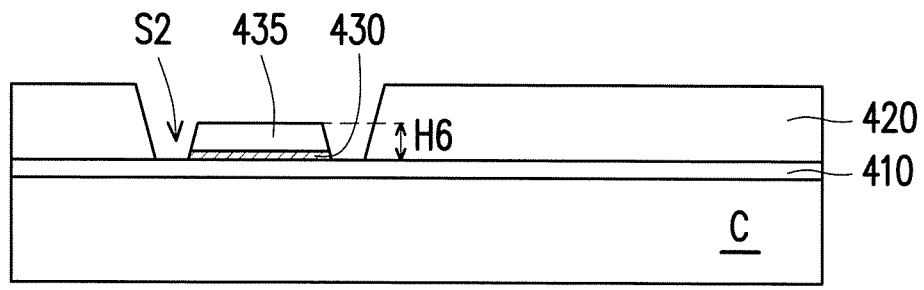

In some embodiments, in FIG. 4E, a metallic block 435 is formed on the exposed seed layer 430. In some embodiments, the metallic block 435 may be formed by plating or deposition. In some embodiments, a material of the metallic block 435 includes, for example, copper, nickel, gold and/or alloys thereof. In some embodiments, after forming the metallic block 435, the masking layer 440 (FIG. 4D) is removed by a stripping solution and the seed layer 430 under the masking layer 440 is exposed and then removed by wet etching. That is, the seed layer 430 is remained only under the metallic block 435 and is located directly under the metallic block 435. In FIG. 4E, the metallic block 435 and the remained seed layer 430 underlying the metallic block 435 are located within the opening S2 and are located on the center or middle portion of the bottom of the opening S2 (i.e. on the first dielectric layer 410 and in the middle of the opening S2). In some embodiments, the metallic block 435 located on the remained seed layer 430 is protruded from the first dielectric layer 410 with a height H6. In some embodiments, the height H6 is about 5~7 microns or about 6 microns. In some embodiments, the opening S2 exposes the protruded metallic block 435 located on the first dielectric layer 410 and a part of first dielectric layer 410. That is, the size of the opening S2 is larger than the protruded metallic block 435. In some embodiments, the shape of the opening S2 may correspond to or resemble with the shape of the metallic block 435. In some embodiments, the shape of the opening S2 may differ from the shape of the metallic block 435. In some embodiments, the material of the metallic block 435 includes copper, nickel, tungsten, titanium, silver, aluminum, gold and/or alloys thereof. In one embodiment, the material of the metallic block 435 includes copper or copper alloys.

Figure 4F:
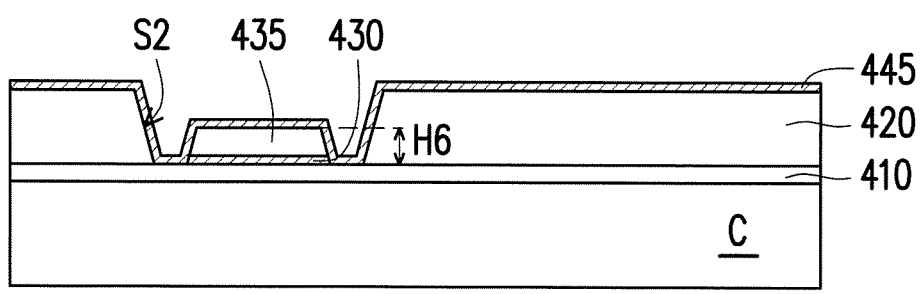

In some embodiments, in FIG. 4F, another seed layer 445 is formed over the second dielectric layer 420 covering the opening S2, the metallic block 435 and the first dielectric layer 410 that is not covered by the second dielectric layer 420 and the metallic block 435 but exposed by the opening S2. In some embodiments, the seed layer 445 is formed covering the second dielectric layer 420 and conformally covering the opening(s) S2 and the metallic block 435 and the exposed first dielectric layer 410. That is, the seed layer 445 at least covers the sidewalls and the top surface of the metallic block 435, the sidewalls of the opening S2 and the top surface of the exposed first dielectric layer 410. In some embodiments, the seed layer 445 is formed by sputtering. In some embodiments, the material of the seed layer 445 may include titanium, tungsten, copper, gold, alloys and/or combinations thereof. In some embodiments, the seed layer 445 includes titanium, copper and/or tungsten. In certain embodiments, the material of the seed layer 445 is different from that of the seed layer 430. In certain embodiments, the material of the seed layer 445 is the same as that of the seed layer 430.

Figure 4G:
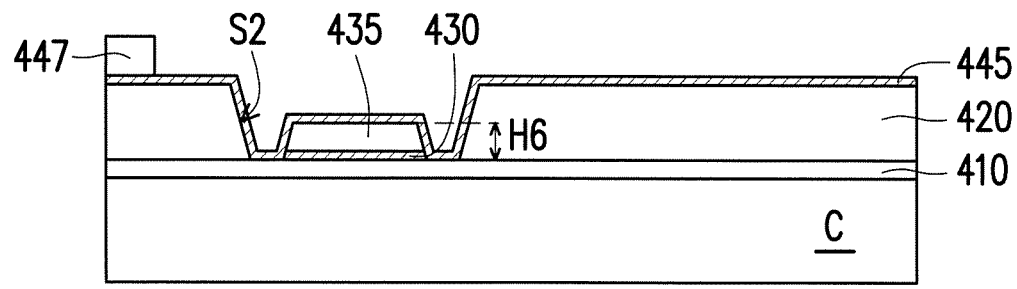

In some embodiments, in FIG. 4G, another masking layer 447 is formed over the second dielectric layer 420 partially covering the seed layer 445. In some embodiments, the masking layer 447 does not cover the seed layer 445 at the locations predetermined for forming the metallic pattern(s). The masking layer 447 at least exposes the seed layer 445 over the opening(s) S2 and portions of the seed layer 445 on the second dielectric layer 420.

Figure 4H:
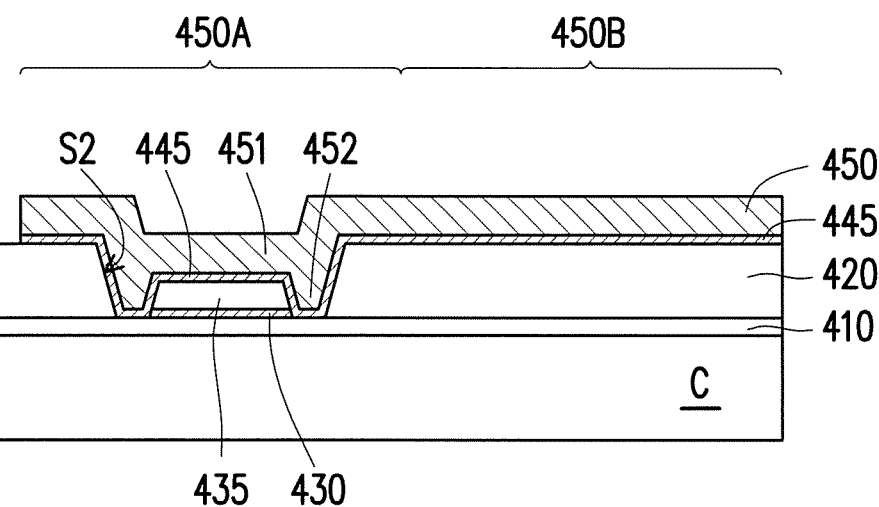

In some embodiments, as shown in FIG. 4H, a metallic pattern 450 is formed on the exposed seed layer 445 over the second dielectric layer 420, filling up the opening(s) S2 and covering the metallic block 435. In some embodiments, the metallic pattern 450 fully covers the opening S2 and the metallic block 435. In some embodiments, the metallic pattern 450 is formed on the seed layer 445 that is not covered by the masking layer 447, and the masking layer 447 is removed. In some embodiments, the metallic pattern 450 may be formed by plating or deposition. In some embodiments, a material of the metallic pattern 450 includes, for example, copper, nickel, tungsten, titanium, silver, aluminum, gold and/or alloys thereof. In certain embodiments, the metallic pattern 450 includes copper or copper alloys. In one embodiment, the material of the metallic block 435 is different from the material of the metallic pattern 450. In one embodiment, the material of the metallic block 435 is the same as the material of the metallic pattern 450. In some embodiments, the formation of the metallic pattern 450 includes forming a metallic material layer (not shown) over the seed layer 445 not cover by the masking pattern 447 and over the second dielectric layer 420 as well as filling up the opening S2 by plating. In some embodiments, after stripping off the masking layer 447, the seed layer 445 under the masking layer 447 (i.e. not covered by the metallic material layer) is then removed by wet etching. That is, the metallic pattern 450 is located on the seed layer 445 and over the second dielectric layer 420, and the metallic pattern 450 fills up the opening(s) S2. In some embodiments, the remained seed layer 445 is sandwiched between the metallic pattern 450 and the second dielectric layer 420 outside the opening S2 and sandwiched between the metallic pattern 450 and the second dielectric layer 420 (i.e. the sidewalls of the opening S2). In some embodiments, the seed layer 445 is sandwiched between the metallic pattern 450 and the metallic block 435 and sandwiched between the metallic pattern 450 and the first dielectric layer 410 within the opening S2. In certain embodiments, the materials of the metallic pattern 450 and the metallic block 435 are different. In certain embodiments, the materials of the metallic pattern 450 and the metallic block 435 are the same.

In some embodiments, in FIG. 4H, the metallic pattern 450 includes joints 450A and routing traces 450B. In some embodiments, when the metallic pattern 450 is formed as an inter-layered redistribution pattern within a redistribution layer, the joint 450A may function as a via. In some embodiments, when the metallic pattern 450 is formed as an outermost redistribution pattern of a redistribution layer, the joint 450A may function as a pad. In some embodiments, within the opening S2, the joint 450A of the metallic pattern 450 includes a pad portion 451 located within the opening S2 and located above the metallic block 435 and a ridge portion 452 around the pad portion 451. In some embodiments, within the opening S2, the remained seed layer 445 is sandwiched between the pad portion 451 and the metallic block 435 and sandwiched between the ridge portion 452 and the first dielectric layer 410 as well as the sidewalls of the opening S2. In some embodiments, within the opening S2, the seed layer 430 is located between the metallic block 435 and the first dielectric layer 410. In some embodiments, due to the existence of the metallic block 435, the gap filling depth of the opening S2 at the center or middle position may be decreased, thus assisting the filling of the metallic pattern into the opening S2 and improving the plating uniformity filling the via opening. Accordingly, a flatter or evener plane of the pad or via may be provided for the subsequently layers formed thereon.

In some embodiments, the processes depicted in FIGS. 4A-4H are compatible with the manufacturing processes for forming the redistribution structure or redistribution layer over the reconstructed wafer or the package. In some embodiments, the processes depicted in FIGS. 4A-4H may be part of a wafer level packaging process, and the above processes may be performed repeatedly for more than one time to form a redistribution structure.

Figure 5A:
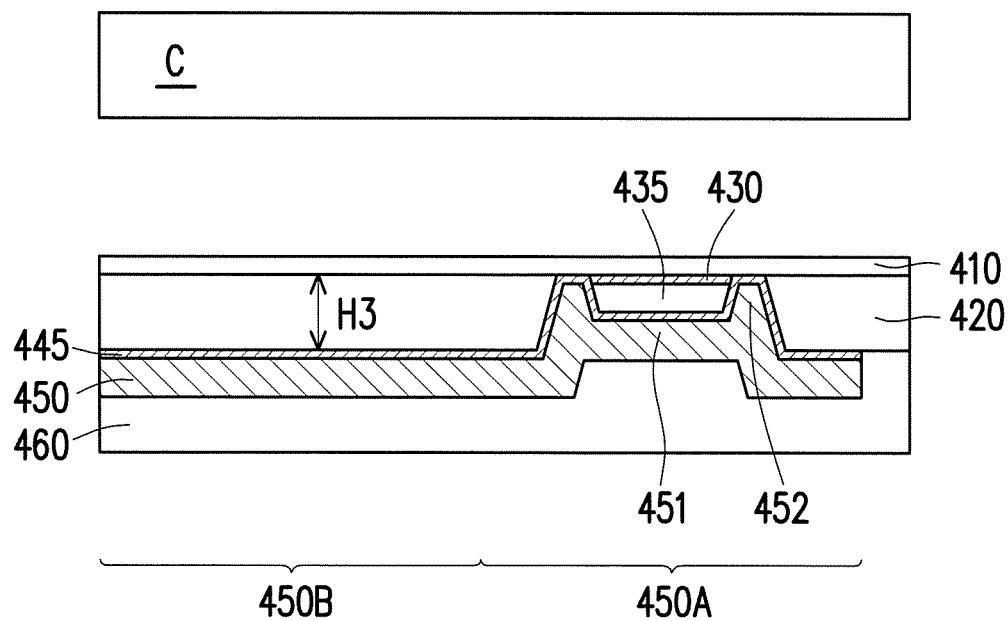
FIG. 5A to FIG. 5C are schematic cross sectional views of various stages in a manufacturing method of a connection structure in a package structure according to some exemplary embodiments of the disclosure.
Figure 5B:
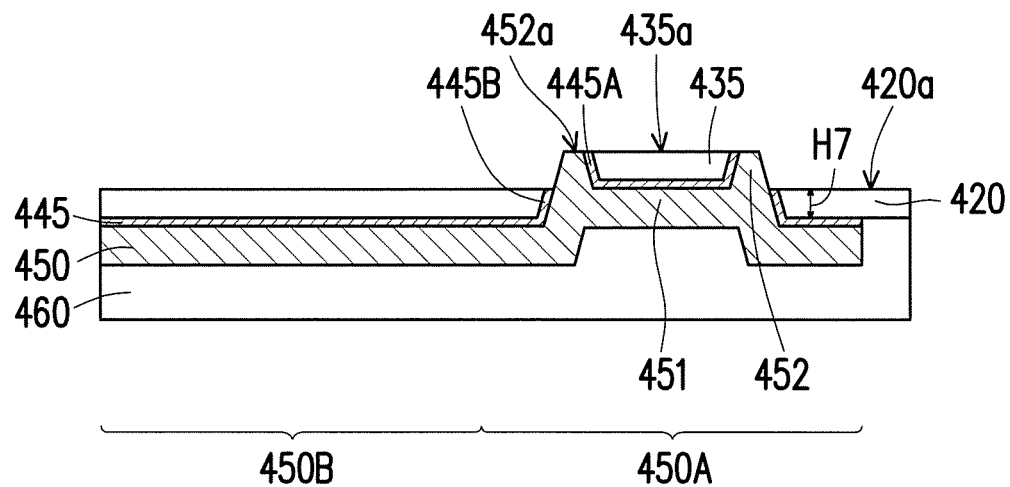
Figure 5C:
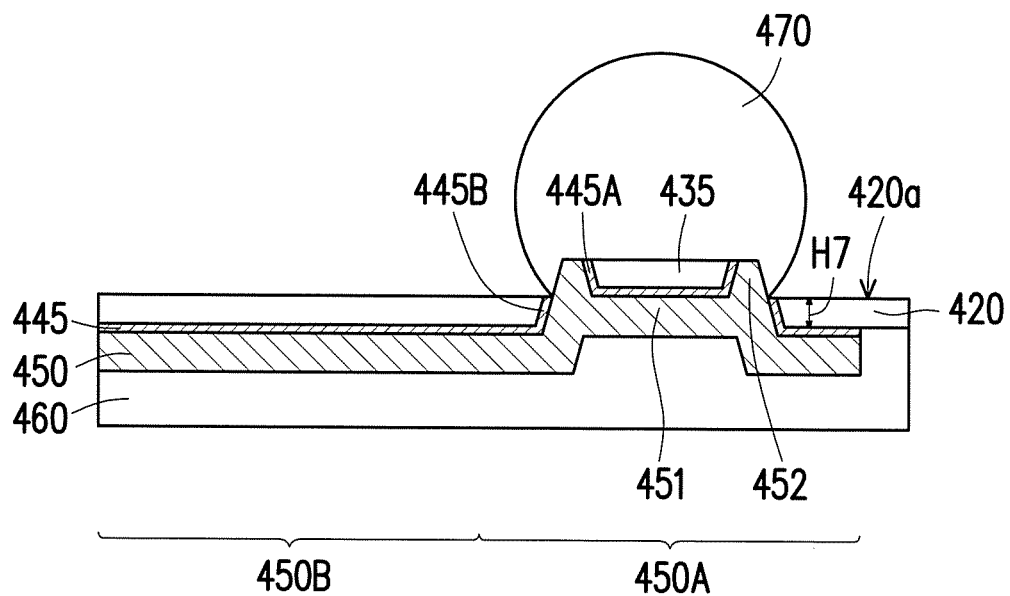

FIG. 5A to FIG. 5C are schematic cross sectional views of various stages in a manufacturing method of a connection structure in a package structure according to some exemplary embodiments of the disclosure. Following the processes depicted in FIGS. 4A-4H, a passivation layer 460 is formed over the whole structure covering the metallic pattern 450 and the second dielectric layer 420. Then, the whole structure is flip and turned upside down. As shown in FIG. 5A, the carrier C is separated from the first dielectric layer 410 and then removed. In FIG. 5B, the first dielectric layer 410 is removed and the seed layer 430 located on the metallic block 435 and the seed layer 445 are also removed until the metallic block 435 and the ridge portion 452 are exposed. In some embodiments, the first dielectric layer 410 is fully removed through the first etching process. In some embodiments, the seed layer 430 is fully removed and the seed layer 445 and the second dielectric layer 420 are partially removed through the second etching process. In some embodiments, the seed layers 430, 445 and the second dielectric layer 420 are etched until the top surface 435a of the metallic block 435 and the top surface 452a of the ridge portion 452 of the metallic pattern 450 are fully exposed. In certain embodiments, the top surface 435a of the metallic block 435 and the top surface 452a of the ridge portion 452 of the metallic pattern 450 are coplanar and flush with each other. That is, the metallic block 435 and the ridge portion 452 are protruded out of the remained second dielectric layer 420 with the same height. In some embodiments, the second dielectric layer 420 is partially removed and the remained second dielectric layer 120 has a height H7 of about 4~6 microns or about 5 microns.

As shown in FIG. 5B, the ridge portion 452 of the metallic pattern 450 is exposed from the second dielectric layer 420 without the seed layer 445 being remained thereon, and the ridge portion 452 is protruded from the surface 420a of the remained second dielectric layer 420 with a height of about 2~3 microns or about 2.5 microns. In one embodiment, the top surface 435a of the metallic block 435 is free of the seed layer 430. In some embodiments, the ridge portion 452 is surrounded by the remained seed layer 445 and the second dielectric layer 120. In some embodiments, the remained seed layer 445 includes a first part 445A sandwiched between the metallic block 435 and the joint 450A of the metallic pattern 450 and a second part 445B sandwiched between the remained second dielectric layer 420 and the metallic pattern 450, except for the ridge portion 452 protruded out of the second dielectric layer 420. In some embodiments, the metallic block 435 and the first part 445A are located on the pad portion 451 of the joint 450A, and the metallic block 435 and the first part 445A are surrounded by the ridge portion 452. As the first and second parts 445A, 445B are made from the same layer, they are made of the same material.

Figure 5D:
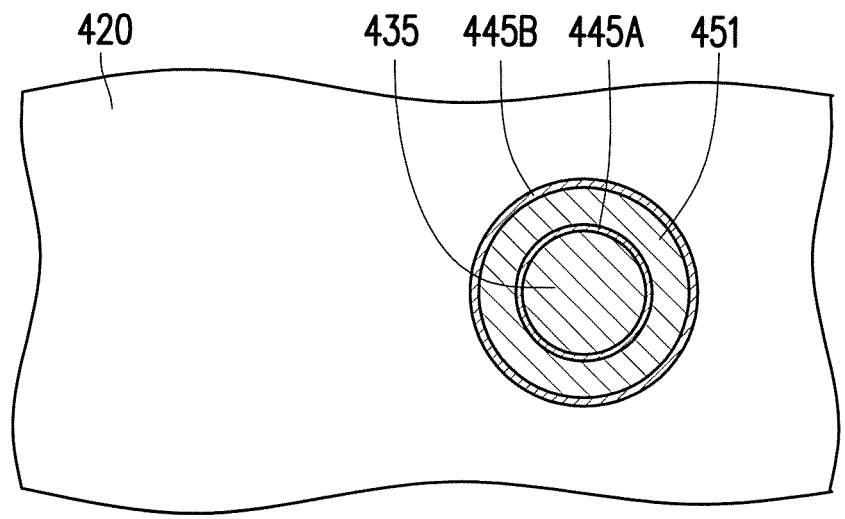
FIG. 5D is a schematic enlarged top view showing a portion of the structure depicted in FIG. 5B.

FIG. 5D is a schematic enlarged top view showing a portion of the structure depicted in FIG. 5B. The joint 450A is depicted as a round pad as an example, the first part 445A of the seed layer 445, the ridge portion 452 and the second part 445B of the seed layer 445 surrounding the round pad portion 451 are shown in round ring shapes and arranged concentrically in FIG. 5D. That is, from the top view, the first part 445A and the second part 445B are shown as two concentric rings and the ring-shaped ridge portion 452 is sandwiched in-between these two rings. However, it is understood the shape(s) and the relative arrangements are not limited by the examples disclosed herein, and other shapes such as tetragonal or polygonal shapes may be applicable.

In FIG. 5C, one or more conductive balls 470 are disposed on the metallic pattern 450. In some embodiments, the conductive ball 470 may be disposed on the joint 450A through a ball placement process. In some embodiments, as shown in FIG. 5C, the conductive ball 470 is located directly on the metallic block 435 and directly contacts the ridge portion 452. That is, the metallic block 435, the pad portion 451 and the ridge portion 452 may function as the ball pad. Additionally, a reflow process or a heating process may be performed. In some embodiments, the conductive ball 470 is attached to the joint 450A of the metallic pattern 450 and is electrically connected with the metallic pattern 450.

Figure 11:
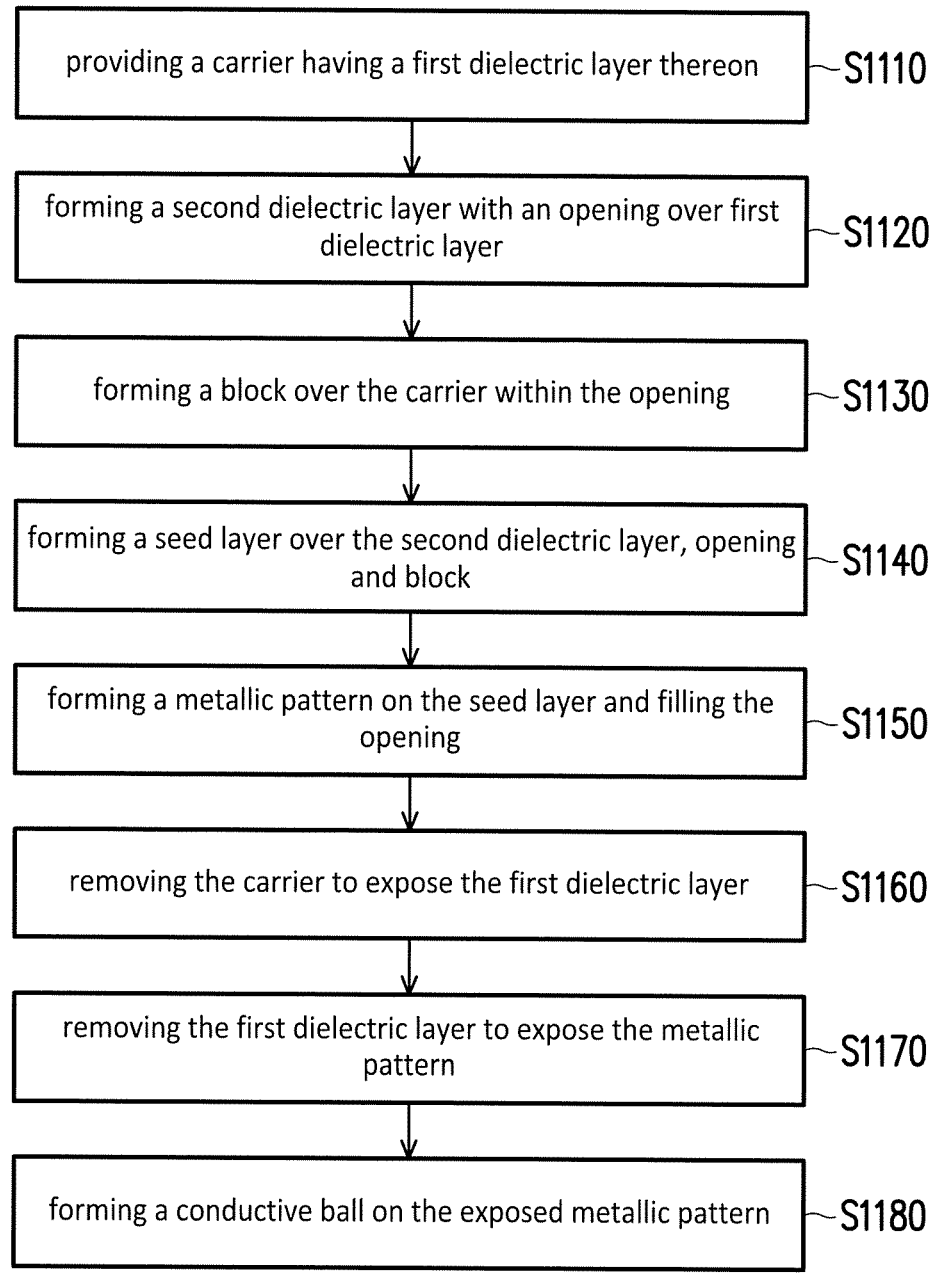
FIG. 11 is an exemplary flow chart showing the process steps of the manufacturing method for forming a connection structure in accordance with some embodiments of the present disclosure.

FIG. 11 is an exemplary flow chart showing the process steps of the manufacturing method for forming a connection structure in accordance with some embodiments of the present disclosure. In Step S1110, a carrier having a first dielectric layer formed thereon is provided. In Step S1120, a second dielectric layer having an opening is formed over the first dielectric layer. In Step S1130, a block is formed over the carrier within the opening. In Step S1140, a seed layer is formed over the second dielectric layer, the opening and the block. In Step S1150, a metallic pattern is formed on the seed layer and fills up the opening. In Step S1160, the carrier is removed to expose the first dielectric layer. In Step S1170, the first dielectric layer is removed to expose the metallic pattern. In Step S1180, a conductive ball is formed on the exposed metallic pattern. In some embodiments, the processes depicted in FIGS. 1A-1F, FIGS. 2A-2D, FIGS. 4A-4H and FIGS. 5A-5D may be summarized as the process steps as shown in FIG. 11, and may be part of a wafer level packaging process.

Figure 6A:
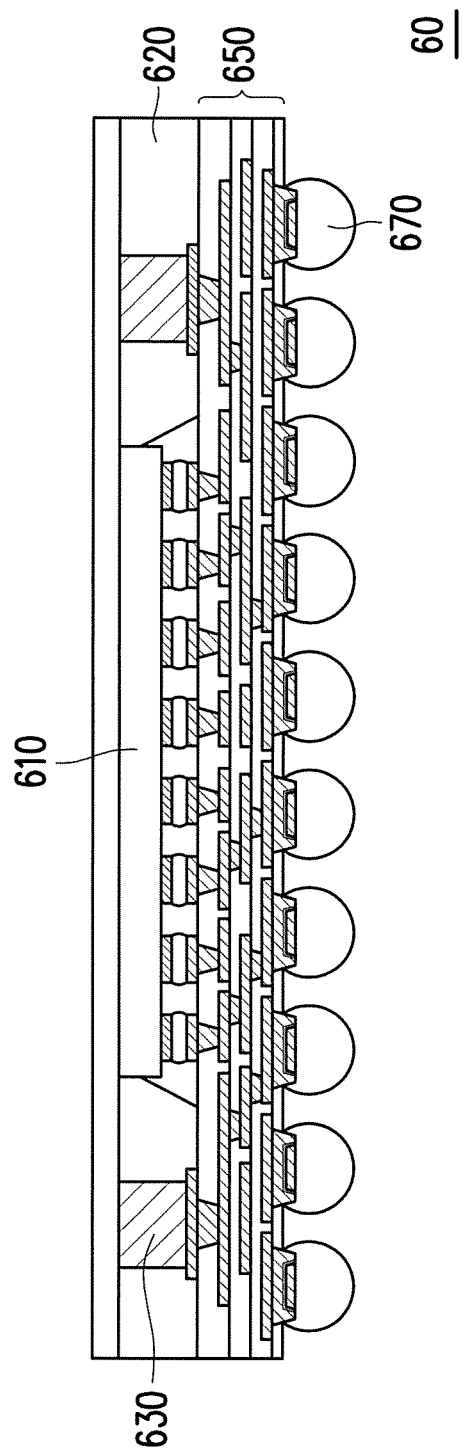
FIG. 6A is a schematic cross sectional view of an exemplary package structure according to some exemplary embodiments of the disclosure.
Figure 6B:
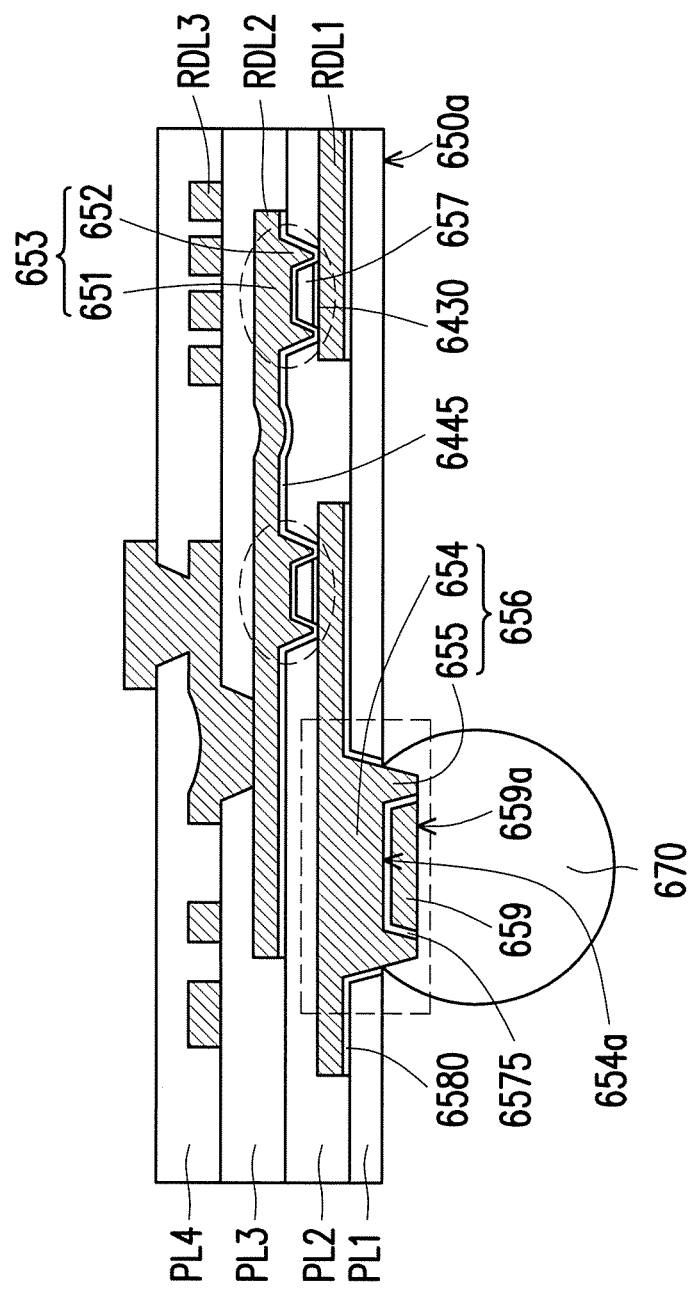
FIG. 6B is a schematic cross sectional enlarged view of a portion of an exemplary package structure according to some exemplary embodiments of the disclosure.

FIG. 6A is a schematic cross sectional view of an exemplary package structure according to some exemplary embodiments of the disclosure. FIG. 6B is a schematic cross sectional enlarged view of a portion of an exemplary package structure according to some exemplary embodiments of the disclosure. In FIG. 6A, the package structure 60 includes at least one die 610 molded in a molding compound 620 and a plurality of through molding vias 630 penetrating through the molding compound 620. In some embodiments, the package structure 60 includes a plurality of conductive balls 670 and a redistribution layer 650 located on the molding compound 620 and between the molding compound 620 and the conductive balls 670. The redistribution layer 650 is electrically connected with the die 610, and some or all of the conductive balls 670 are electrically connected with the die 610. In FIG. 6B, the redistribution layer 650 includes a first redistribution metallic pattern RDL1, a second redistribution metallic pattern RDL2 and a third redistribution metallic pattern RDL3 sandwiched between stacked dielectric layers PL1, PL2, PL3, PL4. As described in the previous embodiments, the processes depicted in FIGS. 4A-4H may be applicable for forming the RDL2. By doing so, the subsequently formed RDL3 having fine pitch routing pattern(s) may be formed on a flatter or less uneven plane, thus improving the reliability of the RDL3 and the redistribution layer. As shown in FIG. 6B, the joints 653 (encircled by round dotted-line circles) together with the metallic block 657 of the RDL2 may function as vias and the joint 653 includes a pad portion 651 located on the metallic block 657 and a ridge portion 652 surrounding the pad portion 651. In certain embodiments, the pad portion 651 and the ridge portion 652 are of the same material. In FIG. 6B, the ridge portion 652 and the metallic block 657 are connected with the underlying RDL1 respectively with the seed layers 6445 and 6430 located in-between. Also, in some embodiments, RDL1 having the joint 656 may be formed following the processes depicted in FIGS. 4A-4H and 5A-5C for forming the joint 450A. In some embodiments, in FIG. 6A & FIG. 6B, the conductive balls 670 are disposed on the bottom surface 650a of the redistribution layer 650. In certain embodiments, the metallic block 659 and the joint 656 (encircled by rectangular dotted-line circle) of the RDL1 for receiving the conductive ball 670 functions as the pad or ball pad, and the conductive ball 670 is in direct contact with and seats on the top surface 659a of the metallic block 659 and the ridge portion 655 of the joint 656. In FIG. 6B, the ridge portion 655 and the metallic block 659 protrude out of the surface 650a of the redistribution layer 650. In some embodiments, the top surface 659a of the metallic block 659 is free of the seed layer. In some embodiments, the metallic block 659 and the seed layer 6575 are located on the bottom surface 654a of the pad portion 654 and is inlaid within the ridge portion 655. In certain embodiments, the seed layer 6575 is sandwiched between the metallic block 659 and the ridge portion 655, while the seed layer 6580 is sandwiched between the joint 656 and the bottommost dielectric layer PL1 of the redistribution layer 650.

Figure 7A:
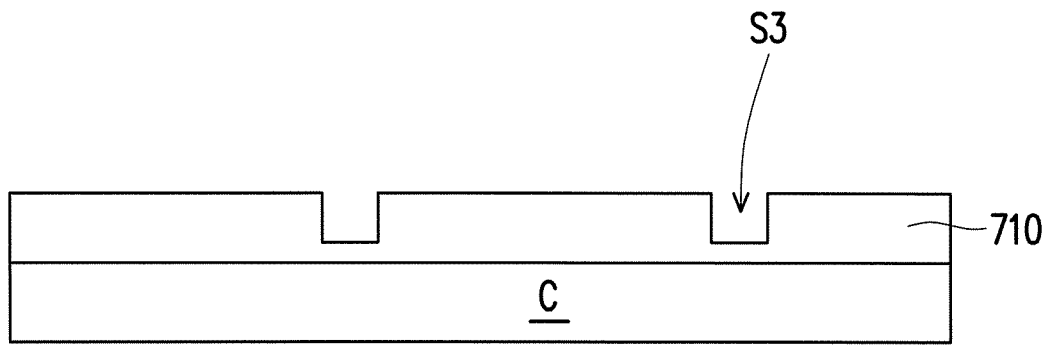
FIG. 7A to FIG. 7I are schematic cross sectional views of various stages in a manufacturing method of a connection structure according to some exemplary embodiments of the disclosure.
Figure 7B:
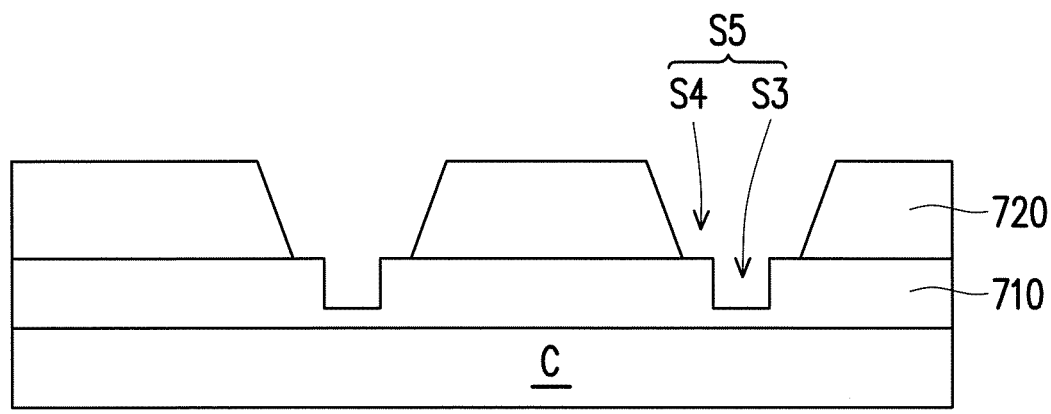

FIG. 7A to FIG. 7I are schematic cross sectional views of various stages in a manufacturing method of a connection structure according to some exemplary embodiments of the disclosure. In FIG. 7A, a carrier C is provided with a first dielectric layer 710 formed thereon. In some embodiments, the first dielectric layer 710 includes a plurality of openings S3. In FIG. 7B, a second dielectric layer 720 having a plurality of openings S4 is formed on the first dielectric layer 710. The openings S4 exposes portions of the underlying first dielectric layer 710 and the openings S3. In some embodiments, the locations of the openings S4 correspond to the locations of the openings S3, but the size of the openings S4 is larger than the size of the openings S3. In some embodiments, the opening S4 and the underlying opening S3 constitute a trench opening S5.

In some embodiments, the first dielectric layer 710 or the second dielectric layer 720 may be formed by coating, printing or deposition. In some embodiments, the first dielectric layer 710 or the second dielectric layer 720 may be a polymeric material layer. In some embodiments, the polymeric material may include polyimide, BCB, PBO or any other suitable polymer materials, for example. In some embodiments, the opening S4 is a through hole penetrating the second dielectric layer 720, while the opening S3 does not penetrate through the first dielectric layer 710. The openings S3, S4 will define the locations and shapes of the subsequently formed joints or stud pads. In the exemplary embodiment, the first dielectric layer 710 or second dielectric layer 720 may be formed by coating and then patterned through the exposure and development processes as described above, and further details will not be repeated herein.

Figure 7C:
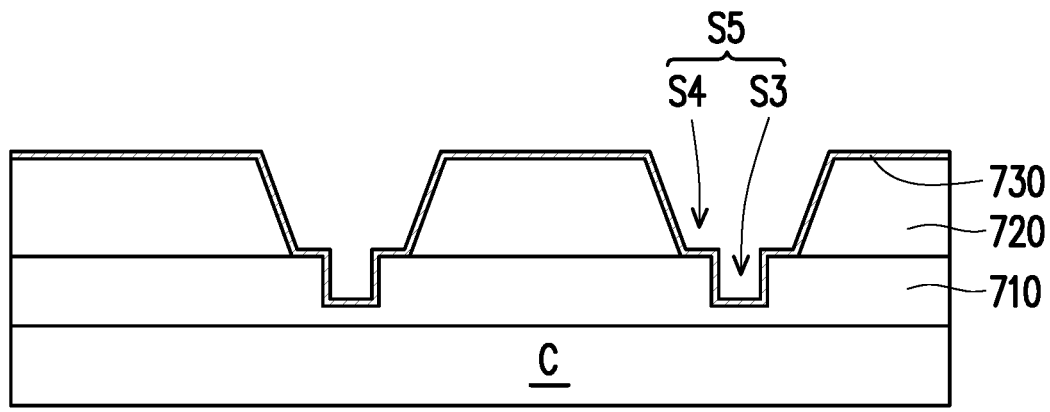

In the exemplary embodiment, as shown in FIG. 7C, a seed layer 730 is formed over the second dielectric layer 720 and the underlying first dielectric layer 710 conformally covering the opening(s) S5. In some embodiments, the seed layer 730 is formed by sputtering. In some embodiments, the material of the seed layer 730 may include titanium, tungsten, copper, gold, alloys and/or combinations thereof. In some embodiments, the seed layer 730 includes titanium, copper and/or tungsten.

Figure 7D:
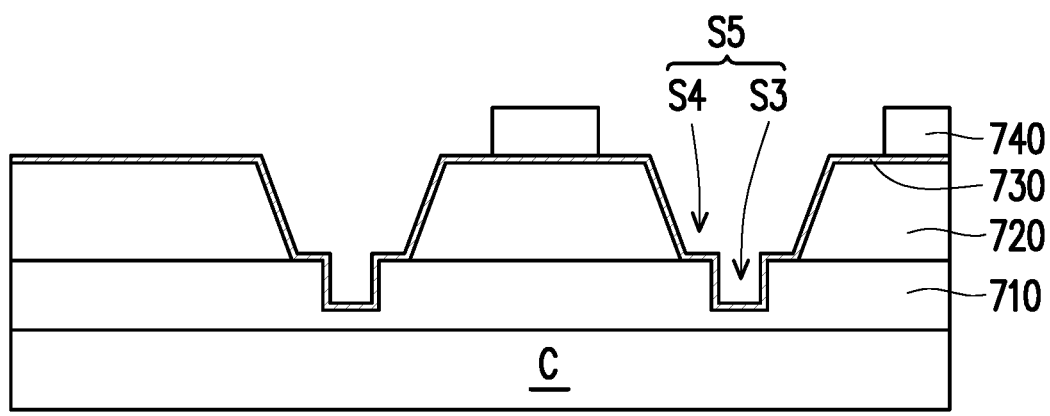

In FIG. 7D, a masking layer 740 is formed on the seed layer 730 and over the second dielectric layer 720. In some embodiments, the masking layer 740 at least exposes the openings S5 and portions of the seed layer on the second dielectric layer 720.

Figure 7E:
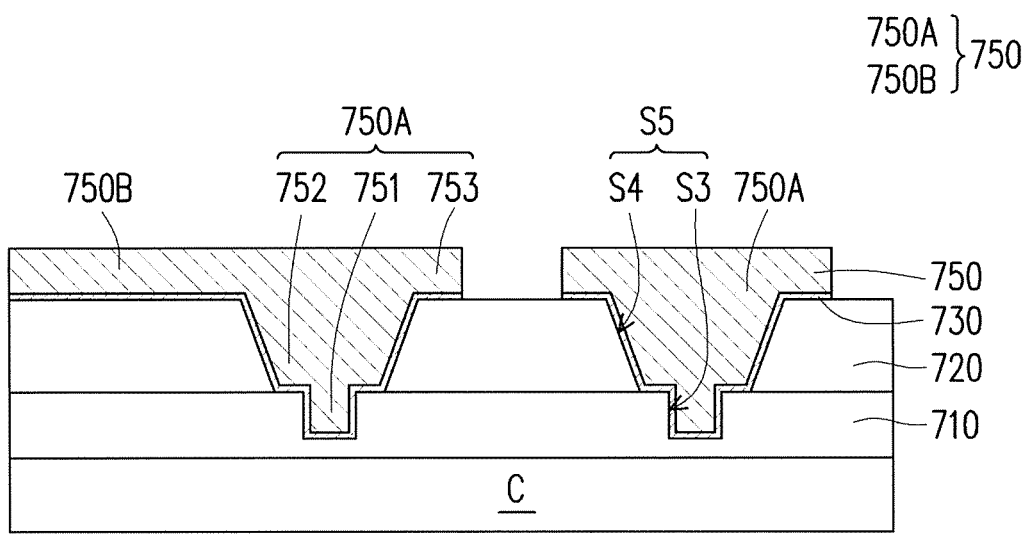

In FIG. 7E, a metallic pattern 750 is formed on the seed layer that is not covered by the masking layer 740. In some embodiments, the metallic pattern 750 is formed on the exposed seed layer 730 over the first and second dielectric layers 710, 720, filling up the openings S5. In some embodiments, the metallic pattern 750 is formed on the seed layer 730 that is not covered by the masking layer 740, and the masking layer 740 is removed. In some embodiments, the metallic pattern 750 may be formed by plating or deposition. In some embodiments, a material of the metallic pattern 750 includes, for example, silver, copper, nickel, titanium, aluminum, gold and/or alloys thereof. In certain embodiments, the metallic pattern 750 includes copper or copper alloys. The formation of the metallic pattern 750, the patterning of the seed layer 730 and the removal of the masking layer 740 may be similar to the previously described processes and the details will not be repeated herein. In some embodiments where the metallic pattern 750 is formed by deposition, a chemical mechanical planarization (CMP) is applied to achieve a planar surface. In some embodiments, the remained seed layer 730 is sandwiched between the metallic pattern 750 and the second dielectric layer 720 outside the opening S5 and sandwiched between the metallic pattern 750 and the first and second dielectric layers 710, 720 within the opening S5. In some embodiments, the metallic pattern 750 includes joints 750A and routing traces 750B.

In some embodiments, when the metallic pattern 750 is formed as an inter-layered redistribution pattern within a redistribution layer, the joint 750A may function as a via. In some embodiments, when the metallic pattern 750 is formed as an outermost redistribution pattern of a redistribution layer, the joint 750A may function as a stud pad.

In some embodiments, in FIG. 7E, within the opening S5, the joint 750A of the metallic pattern 750 includes a stud portion 751 that is located mainly within the opening S3 and is surrounded by the first dielectric layer 710, and a plug portion 752 that is located above the stud portion 751, mainly within the opening S4 and surrounded by the second dielectric layer 720. If the opening S3 or S4 is a round or oval opening, the shape of the stud portion 751 or the plug portion 752 may be a round or oval post or block. The joint 750A further includes a pad portion 753 that is located on the plug portion 752 and on the seed layer 730 but is located above the second dielectric layer 720 (i.e. outside of the opening S5). In one embodiment, the size (diameter) of the round opening S3 is smaller than the size (diameter) of the round opening S4, the size (diameter) of the stud portion 751 is smaller than the size (diameter) of the plug portion 752. In one embodiment, the pad portion 753 may be shaped like a round pad or a rectangular pad or a polygonal pad. For example, the size (diameter) of the plug portion 752 is smaller than the size (or maximum width) of the pad portion 753. In some embodiments, the joint 750A may shaped as a three-tier cake structure. In certain embodiments, as the stud portion 751, the plug portion 752 and the pad portion 753 are formed by the same process using the same material, the materials of the stud portion 751, the plug portion 752 and the pad portion 753 are the same. In some embodiments, the remained seed layer 730 is sandwiched between the joint 750A and the second dielectric layer 720 as well as sandwiched between the bottom and the sidewalls of the opening S5 and the joint 750A of the metallic pattern 750. In some embodiments, the presence of the protruded stud portion 751 increases the contact area between the joint 750A and the later formed conductive balls, thus improving the connection reliability.

Figure 7F:
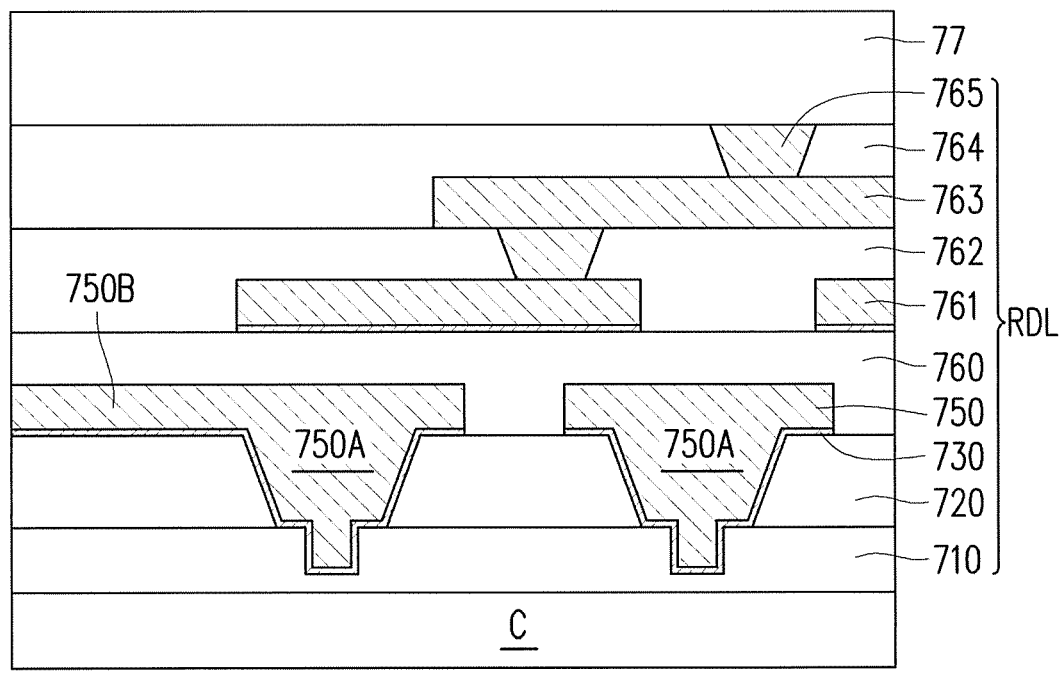

In FIG. 7F, dielectric layers 760, 762, 764 and redistribution patterns 761, 763, 765 are sequentially formed in alternation over the metallic pattern 750 and the second dielectric layer 720. In some embodiments, the layers above the carrier C may be regarded as a redistribution layer or a redistribution structure RDL. In some embodiments, a sub-package or a package 77 may be stacked on the redistribution layer or redistribution structure RDL.

Figure 7G:
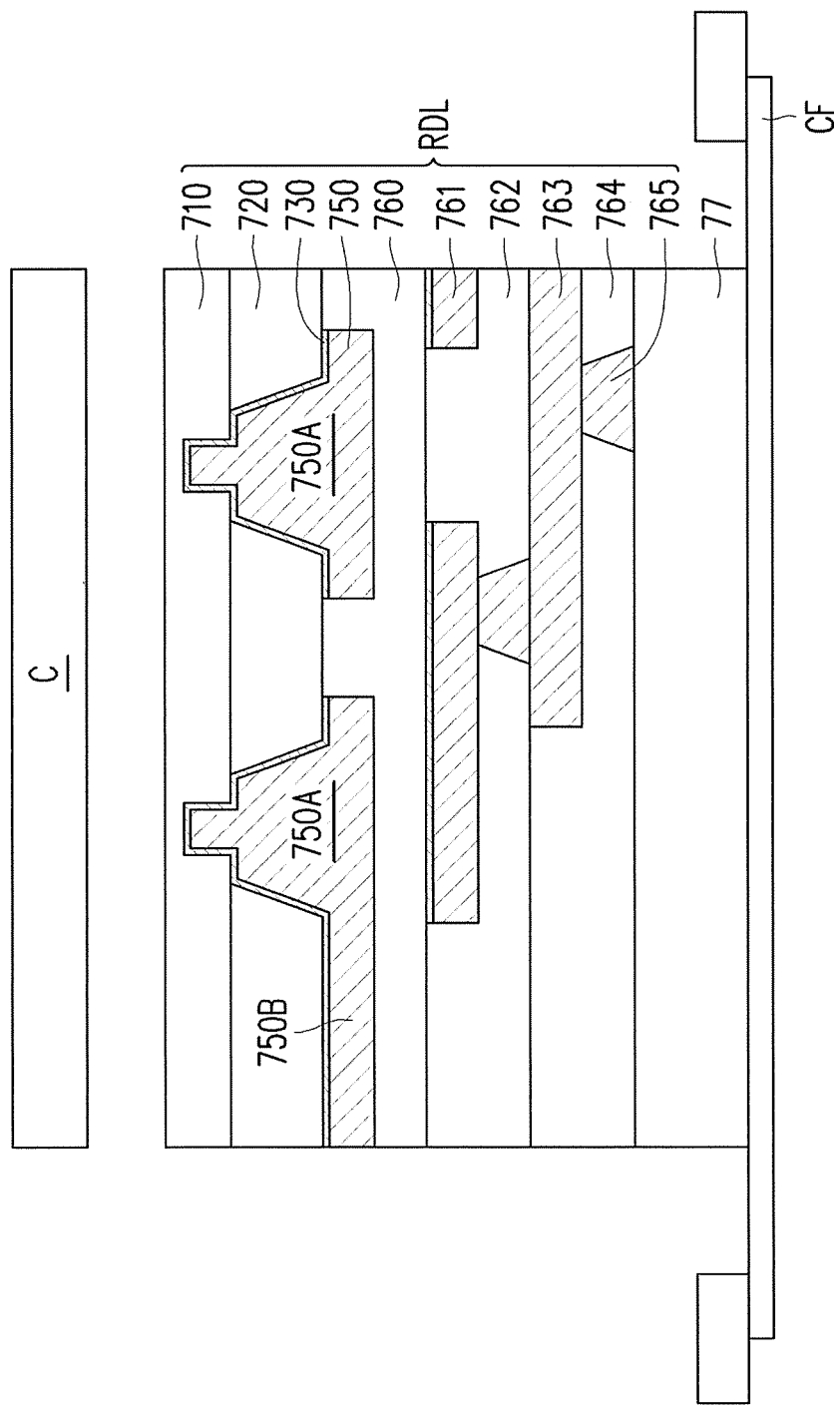

In FIG. 7G, the whole structure is flip and turned upside down and then placed on a carrier film CF. As shown in FIG. 7G, the carrier C is separated from the first dielectric layer 710 and then removed.

Figure 7H:
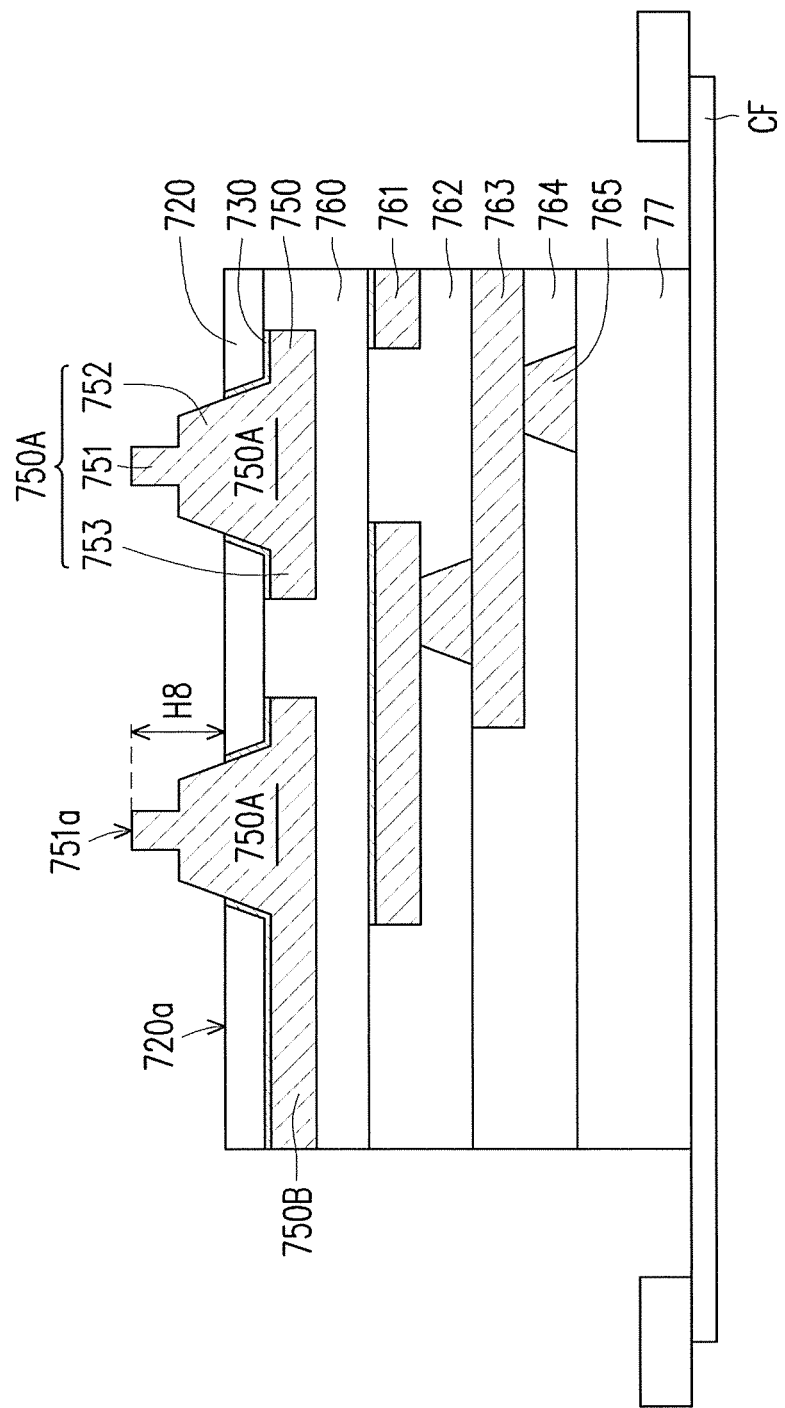

In FIG. 7H, the first and second dielectric layer 710, 720 are removed and the seed layer 730 located on the joint 750A is also removed until the plug portion 752 of the joint 750A is exposed. In some embodiments, the first dielectric layer 710 is fully removed though etching. In some embodiments, the seed layer 730 covering the stud portion 751 is fully removed to completely expose the stud portion 751. In some embodiments, the seed layer 730 covering the plug portion 752 and the second dielectric layer 720 are partially removed through one or more etching processes. In some embodiments, the second dielectric layer 720 is only partially removed to reduce its thickness for exposing parts of the plug portion 752, but the second dielectric layer 720 is not completely removed. As shown in FIG. 7H, the stud portion 751 and a part of the plug portion 752 are exposed from the surface 720a of the second dielectric layer 720 without the seed layer 730 being remained thereon, and the protruded height H8 is measured from the surface 720a of the remained second dielectric layer 720 to the surface 751a of the stud portion 751. In one embodiment, the height H8 is about 2~10 microns. In some embodiments, another part of the plug portion 752 embedded within the second dielectric layer 720 is surrounded by the remained seed layer 730 and the second dielectric layer 720.

Figure 7I:
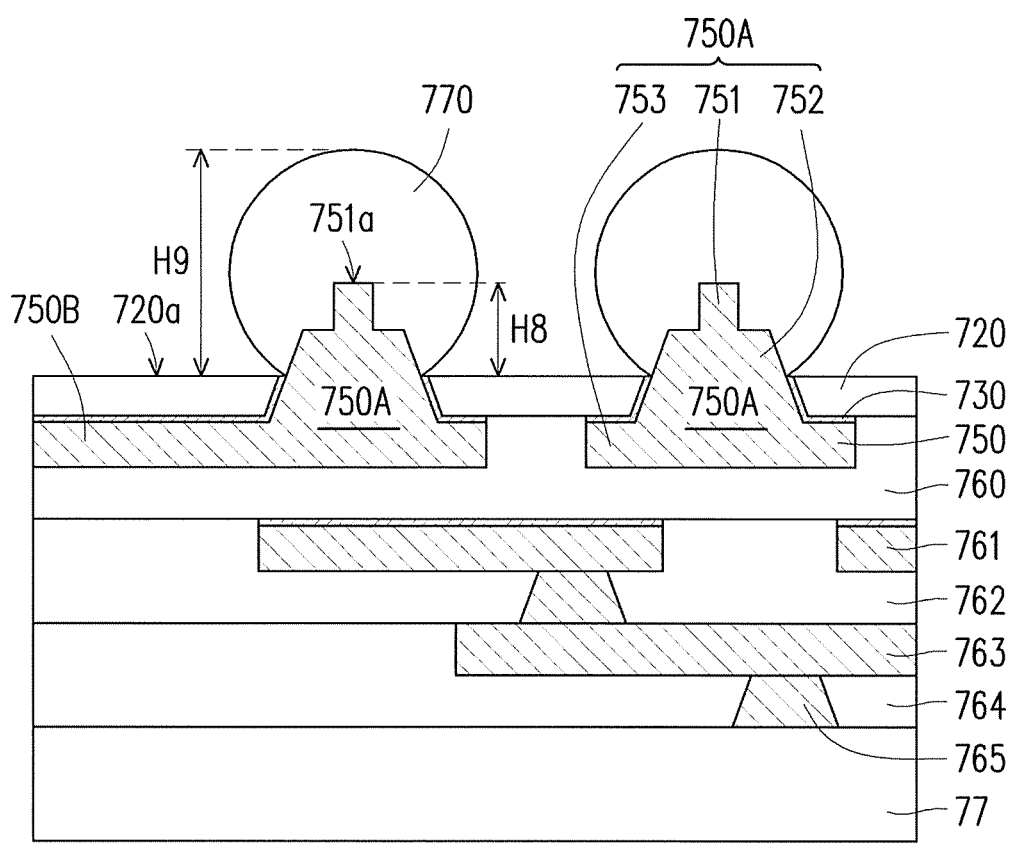

In FIG. 7I, conductive balls 770 are disposed on the joints 750A of the metallic pattern 750 and on the surface 720a of the second dielectric layer 720. Additionally, a reflow process or a heating process may be performed. In some embodiments, as shown in FIG. 7I, the conductive ball 770 is located directly on and directly contacts the stud portion 751 and a part of the plug portion 752. That is, the stud portion 751 and the plug portion 752 of the joint 750A may function as the ball pad. In some embodiments, the conductive balls 770 are attached to the joints 750A of the metallic pattern 750 and is electrically connected with the metallic pattern 750. Later on, the carrier film may be removed. In some embodiments, the conductive balls may be solder balls or ball grid array (BGA) balls, and the material of the conductive balls includes Sn-based solder materials, lead-free solder materials, and/or noble metal alloys including silver and gold. In some embodiments, the protruded height H8 is about 2%~20% of a height H9 of the conductive ball 770. In one embodiment, the conductive ball 770 is in direct contact with the seed layer 730. In alternative embodiments, the conductive ball 770 is not in direct contact with the seed layer 730.

In the previous embodiment, the joint 750A together with the conductive ball 770 described herein may be considered as a connection structure for connecting dies or packages.

Figure 8:
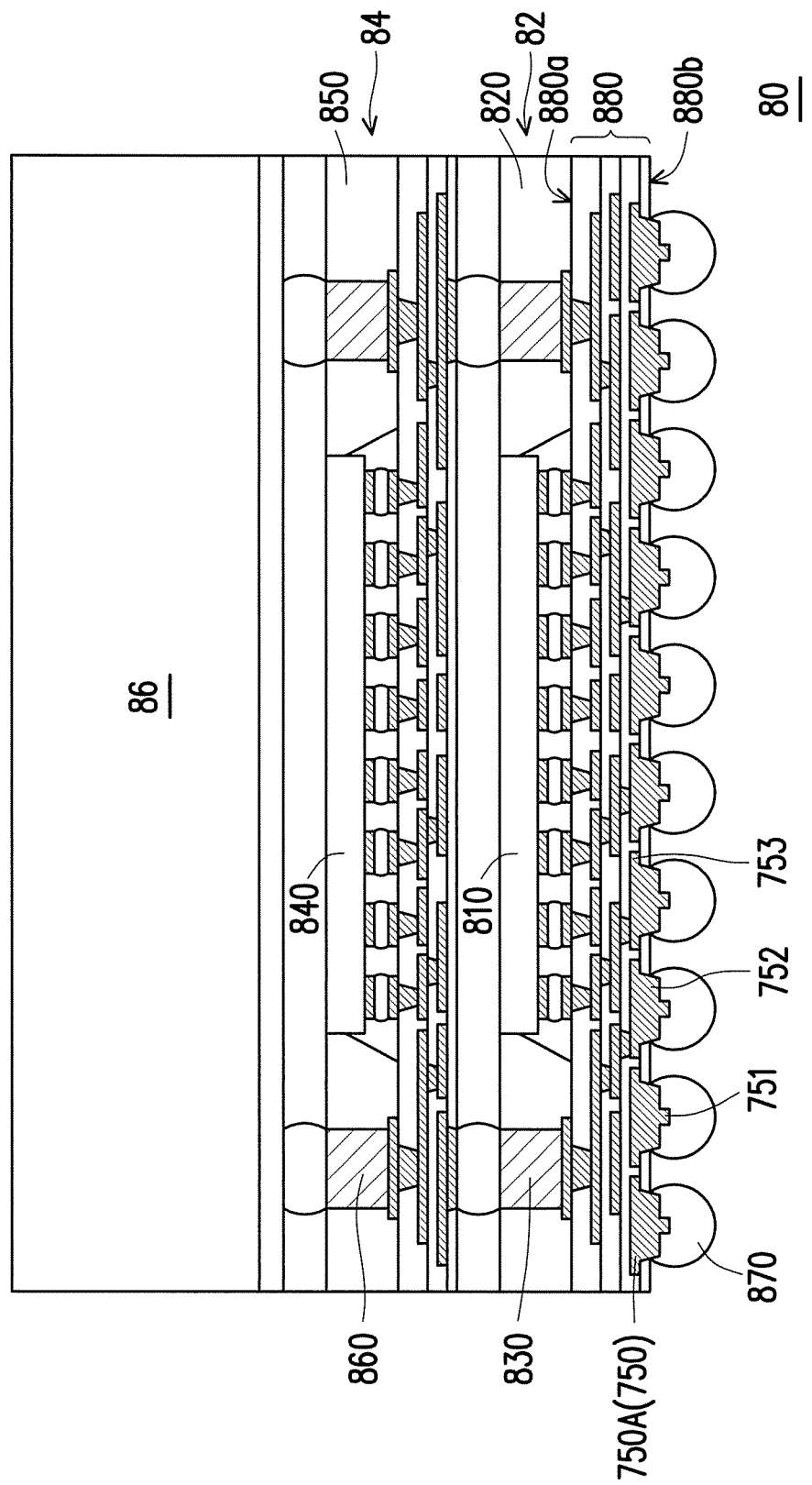
FIG. 8 is a schematic cross sectional view of an exemplary package structure according to some exemplary embodiments of the disclosure.

FIG. 8 is a schematic cross sectional view of an exemplary package structure according to some exemplary embodiments of the disclosure. In FIG. 8, the package structure 80 includes a first sub-package 82 and a second sub-package 84 stacked on the first sub-package 82. In FIG. 8, the package structure 80 may further include a top package 86. In some embodiments, the first sub-package 82 has at least one first die 810 molded in a first molding compound 820 and a plurality of through molding vias 830 penetrating through the molding compound 820. In some embodiments, the second sub-package 84 has at least one second die 840 molded in a second molding compound 850 and a plurality of through molding vias 860 penetrating through the molding compound 850. In some embodiments, the package structure 80 includes a plurality of conductive balls 870 and a redistribution layer 880 located on the molding compound 820 of the first sub-package 82 and between the molding compound 820 and the conductive balls 870. The conductive balls 870 are disposed on the bottom surface 880b of the redistribution layer 880, while the molding compound 820 and the first die 810 are disposed on the top surface 880a of the redistribution layer 880. The first die 810 of the first sub-package 82 is electrically connected with the redistribution layer 880, and the conductive balls 870 are electrically connected with the redistribution layer 880. Some of the conductive balls 870 are electrically connected with the die 810 or 840 or with the top package 86. In FIG. 8, the redistribution layer 880 includes at least a redistribution metallic pattern 750 having more than one joints 750A. As described in the previous embodiments, the processes depicted in FIGS. 7A-7I may be applicable for forming the redistribution layer 880 or the metallic pattern 750. Through the formation of the joints 750A having at least the stud portions 751, the contact area between the joints 750A and the subsequently formed conductive balls 870 is increased, thus improving the reliability of the connection structure and the redistribution layer. As shown in FIG. 8, the joints 750A are in direct contact with the conductive balls 870 with the stud portions 751 rooted in the conductive balls 870 and the conductive balls 870 seat on the joints 750A.

FIG. 9A to FIG. 9H are schematic cross sectional views of various stages in a manufacturing method of a connection structure in a package structure according to some exemplary embodiments of the disclosure. In some embodiments, a wafer 90 having a plurality of semiconductor dies 900 (only one die is shown herein) is provided. In some embodiments, the wafer 90 may be a semiconductor wafer or a reconstructed wafer. In some embodiments, each die 900 includes a semiconductor substrate 902, contact pads 904, conductive elements 906 and a passivation layer 908. In some embodiments, the semiconductor substrate 902 may be a silicon substrate including active components (e.g., transistors or the like) and optionally passive components (e.g., resistors, capacitors, inductors or the like) formed therein. The conductive elements 906 are disposed on the contact pads 904 and are electrically connected to the contact pads 904. The materials of the contact pads 904 or the conductive elements 906 may include aluminum, copper, alloys thereof or other suitable metallic materials. In some embodiments, the passivation layer 908 exposes the conductive elements 906.

Figure 9A:
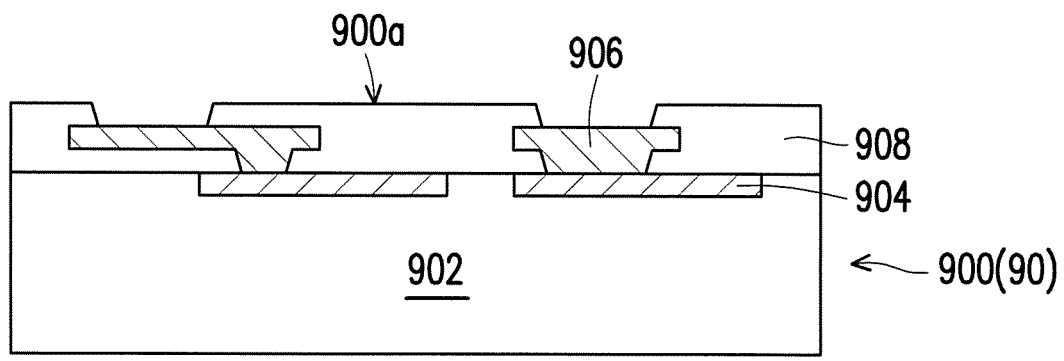
FIG. 9A to FIG. 9H are schematic cross sectional views of various stages in a manufacturing method of a connection structure in a package structure according to some exemplary embodiments of the disclosure.
Figure 9B:
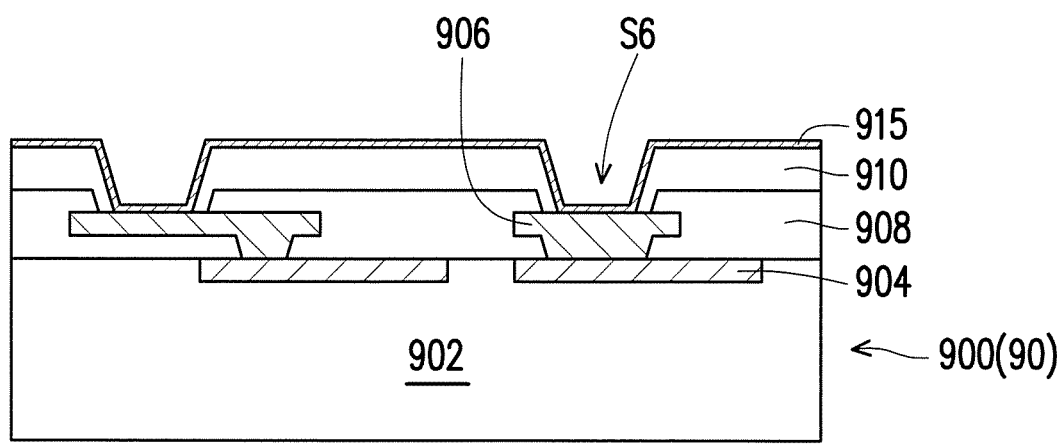

In FIG. 9B, a first dielectric layer 910 having openings S6 is formed over the active surface 900a (FIG. 9A) of the semiconductor die 900, over the passivation layer 908, covering the passivation layer 908, and the openings S6 expose the conductive elements 906. Then a seed layer 915 is conformally formed over the first dielectric layer 910, covering the sidewalls of the openings S6 and the exposed conductive elements 906. As described in the above embodiments, the formation and the materials of the seed layer will not be repeated herein.

Figure 9C:
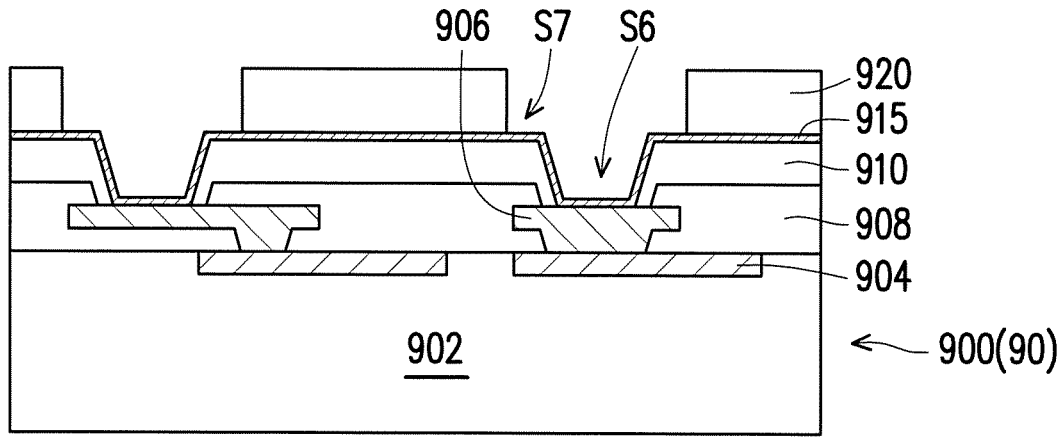

In FIG. 9C, a masking layer 920 having openings S7 is formed over the seed layer 915, and the openings S7 expose at least the seed layer 915 over the opening S6.

Figure 9D:
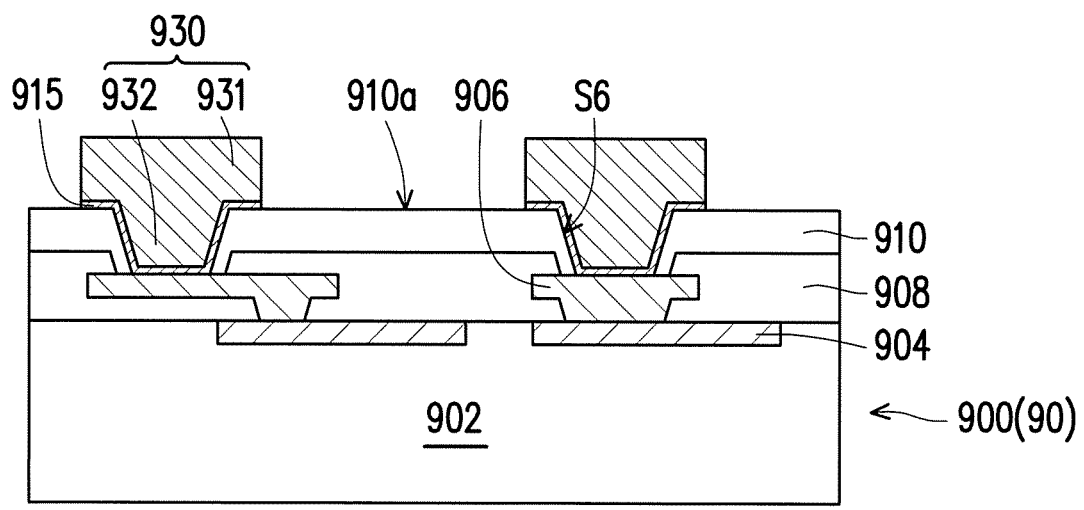

In FIG. 9D, metallic portions 930 are formed on the seed layer 915 that is not covered by the masking layer 920. In some embodiments, the metallic portions 930 fill up at least the openings S6, S7 and cover portions of the seed layer 915 around the openings S6. In some embodiments, the metallic portions 930 include metallic plug portions 931 filling up the opening S7 (FIG. 9C) and metallic pad portions 932 filling up the opening S6. As shown in FIG. 9D, the metallic plug portions 931 is mainly located above the top surface 910a of the first dielectric layer 910 and protrude from the top surface 910a of the first dielectric layer 910. In FIG. 9D, after removing the masking layer 920, the seed layer 915 that is exposed through the removal of the masking layer 920 is removed and the remained seed layer 915 is located between the metallic portions 930 and the first dielectric layer 910.

Figure 9E:
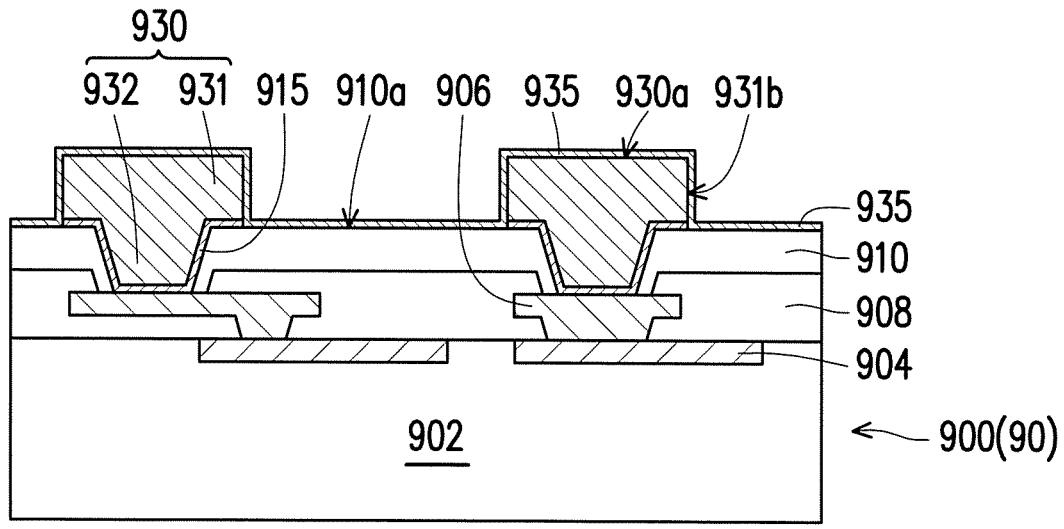

In FIG. 9E, another seed layer 935 is conformally formed on the first dielectric layer 910 and conformally covers the metallic plug portions 931. That is, the seed layer 935 at least covers the sidewalls 931b and the top surfaces 930a of the protruded metallic plug portions 931 of the metallic portions 930. In certain embodiments, the material of the seed layer 935 is different from that of the seed layer 915. In certain embodiments, the material of the seed layer 935 is the same as that of the seed layer 915.

Figure 9F:
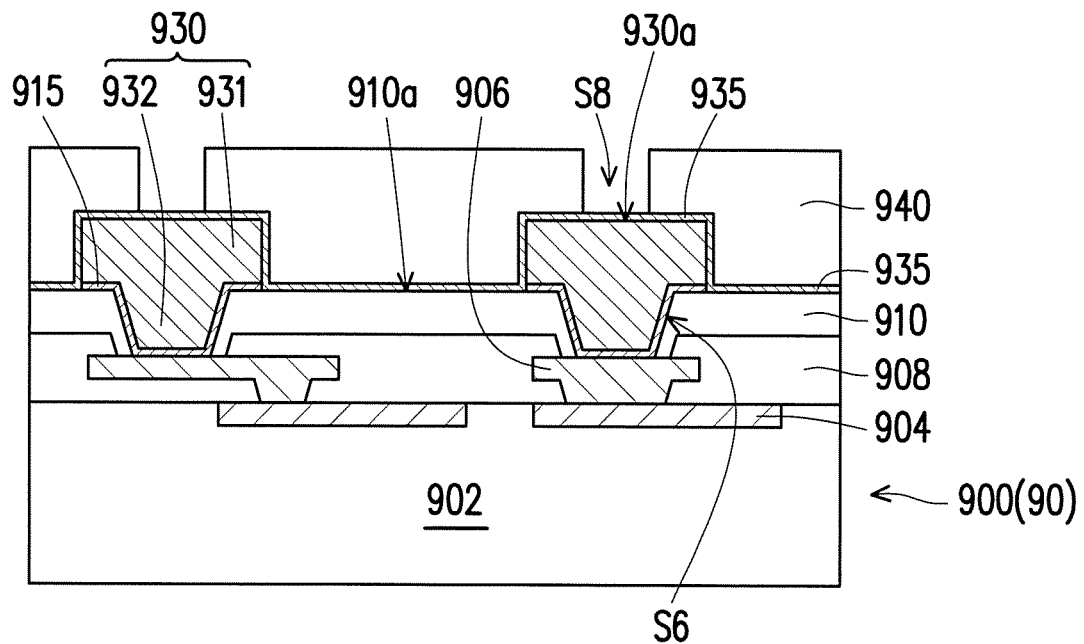

In FIG. 9F, another masking layer 940 having openings S8 is formed over the seed layer 935, and the openings S8 expose at least the seed layer 935 on the top surfaces 930a of the metallic plug portions 931 above the locations of the openings S6.

Figure 9G:
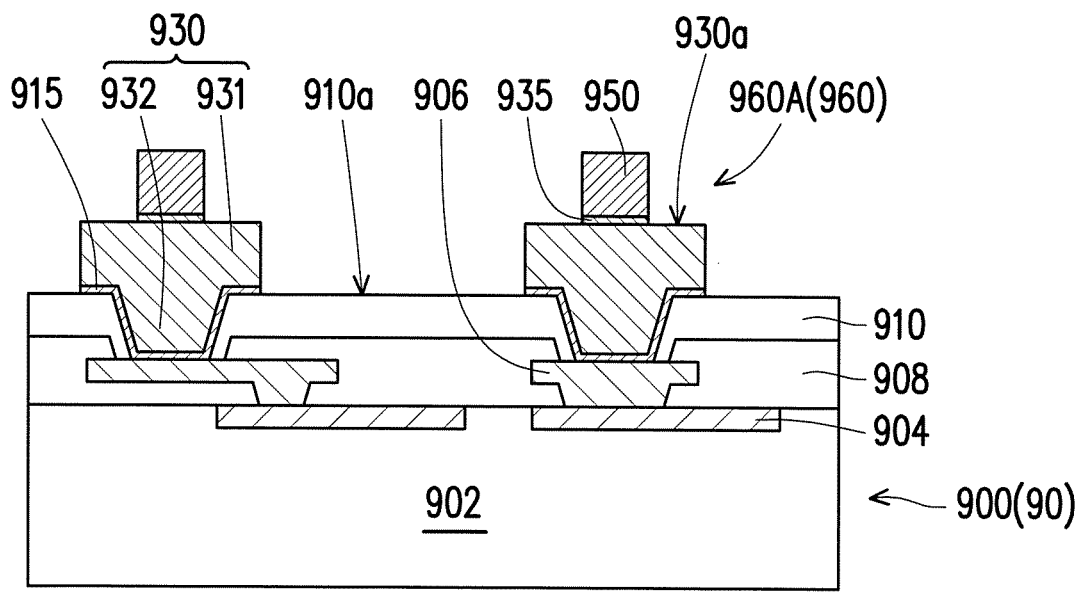

In FIG. 9G, metallic stud portions 950 are formed on the seed layer 935 that is not covered by the masking layer 940. In some embodiments, the metallic stud portions 950 fill up at least the openings S8. As shown in FIG. 9G, the metallic stud portions 950 are located on and protrude from the top surfaces 930a of the metallic plug portions 931. In FIG. 9G, after removing the masking layer 940, the seed layer 935 that is exposed through the removal of the masking layer 940 is removed and the remained seed layer 935 is located between the metallic stud portions 950 and the metallic plug portions 931. The metallic stud portions 950 are connected to and located on the metallic portions 930 in a one-to-one manner. For example, the stud portion 950 may be located near the midpoint of the top surface 930a of the plug portion 931. The formation and materials of the metallic patterns 930 or the metallic stud portions 950 are similar to the above described embodiments, and details will not be repeated herein. In certain embodiments, as the plug portion 931 and the pad portion 932 are formed by the same process using the same material, the materials of the plug portion 931 and the pad portion 932 are the same. In one embodiment, the material of the stud portion 950 is the same as the materials of the plug portion 931 and the pad portion 932. In another embodiment, the material of the stud portion 950 is different to the materials of the plug portion 931 and the pad portion 932.

In some embodiments, when the opening S6, S7, or S8 is round or oval openings, the shape of the pad portion 932, the plug portion 931 or the stud portion 950 may be a round or oval post or block. In one embodiment, the size (diameter) of the round opening S6 is smaller than the size (diameter) of the round opening S7, the size (diameter) of the pad portion 932 is smaller than the size (diameter) of the plug portion 931. For example, the size of the opening S8 is smaller than the sizes of the openings S6, S7, and the size (diameter) of the stud portion 950 is smaller than the size of the pad portion 932 or the plug portion 931.

Figure 9H:
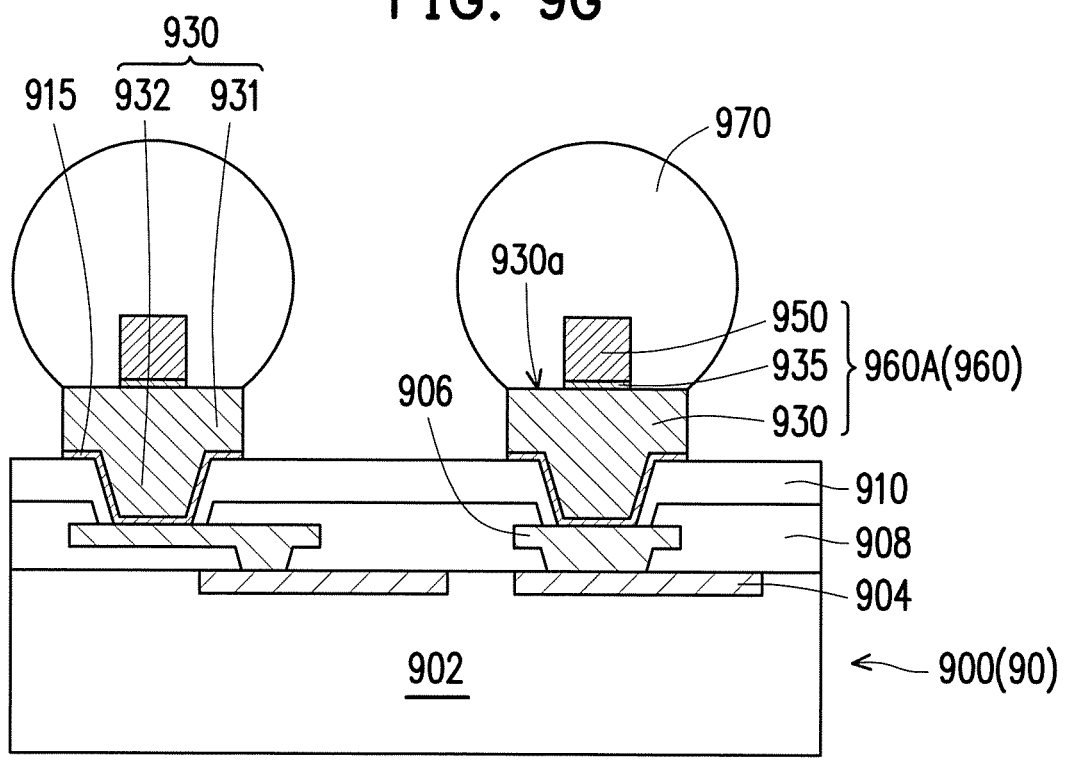

In FIG. 9H, conductive bumps 970 are disposed on the metallic stud portions 950 and the metallic plug portions 931. Additionally, a reflow process or a heating process may be performed. In some embodiments, as shown in FIG. 9H, the conductive bump 970 seats on the metallic plug portion 931 and the metallic stud portion 950 is inserted into the conductive bump 970. That is, the conductive bumps are located directly on the top surfaces 930a of the plug portions 931 and directly contacts the stud portions 950 and the top surfaces 930a of the plug portions 931. That is, the metallic stud portion 950 and the metallic portion 930 may function as the bump pad. In some embodiments, the metallic stud portions 950 and the metallic portions 930 constitute joints 960A and the joints 960A may be parts of connection structures of the die. In some embodiments, the joint 960A includes the seed layer 935 sandwiched between the stud portion 950 and the seed layer 915 sandwiched between the metallic portion 930 and the first dielectric layer 910. In some embodiments, the conductive bumps 970 are attached to the metallic stud portions 950 and the metallic plug portions 931 and are electrically connected with the joints 960A. Also, the joints 960A formed on the conductive elements 906 are electrically connected with the semiconductor die(s) 900. In some embodiments, the conductive bumps 970 may be solder bumps, copper bumps or gold bumps, and the material of the conductive bumps includes Sn-based solder materials, lead-free solder materials, copper, copper alloys and/or noble metal alloys including silver or gold.

In the previous embodiment, the joint 960A together with the conductive bump 970 described herein may be considered as a connection structure for connecting dies or packages.

Figure 10:
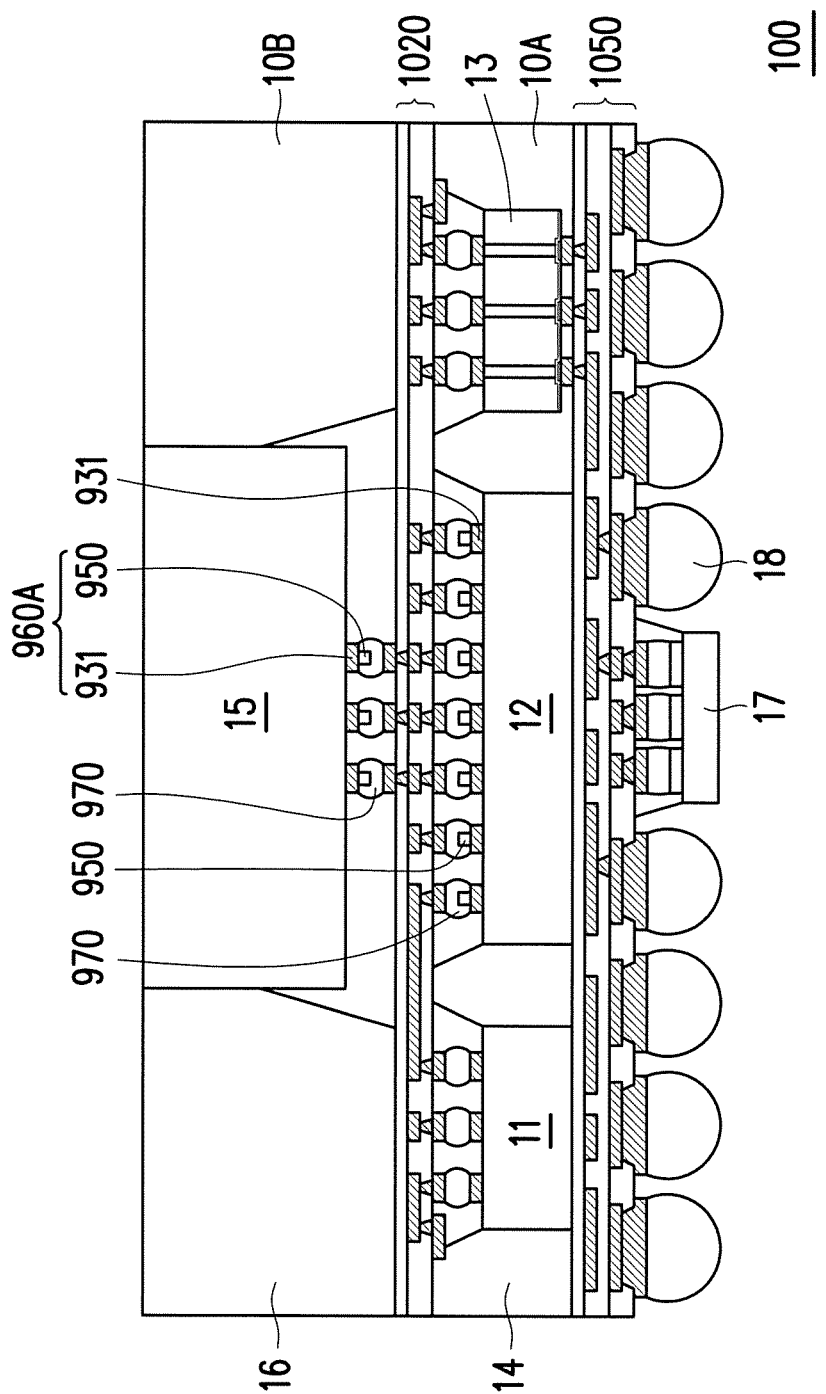
FIG. 10 is a schematic cross sectional view of an exemplary package structure according to some exemplary embodiments of the disclosure.

FIG. 10 is a schematic cross sectional view of an exemplary package structure according to some exemplary embodiments of the disclosure. In FIG. 10, the package structure 100 includes a first sub-package 10A and a second sub-package 10B stacked on the first sub-package 10A. In some embodiments, the first sub-package 10A has a first die 11, a second die 12 and a third die 13 molded in a first molding compound 14. In some embodiments, the second sub-package 10B has at least one fourth die 15 molded in a second molding compound 16. In certain embodiments, at least two or all of the first, second, third and fourth dies are different types of dies. Optionally, the package structure 100 further includes one or more passive components 17. In some embodiments, the package structure 100 includes a plurality of conductive balls 18, a redistribution layer 1050 located on the molding compound 14 of the first sub-package 10A and between the molding compound 14 and the conductive balls 18, and a redistribution layer 1020 located between the sub-packages 10A, 10B. The redistribution layer 1020 is electrically connected with the dies 11, 12, 13, 15. The redistribution layer 1050 is electrically connected with dies 11, 12, 13, and some or all of the conductive balls 18 are electrically connected with the die 11, 12 or 13 through the redistribution layer 1050. In some embodiments, at least one of the first, second, third and fourth dies includes joints 960A and bumps 970 as the connection structures to the sub-package. As described in the previous embodiments, the processes depicted in FIGS. 9A-9H may be applicable for forming the joints 960A. In FIG. 10, the second die 12 is connected with the sub-package 10B through the joints 960A, the bumps 970 and the redistribution layer 1020. In some embodiments, the fourth die 15 is connected with the sub-package 10A through the joints 960A, the bumps 970 and the redistribution layer 1020. Through the formation of the joints 960A having at least the stud portions 950, the contact area between the joints 960A and the subsequently formed conductive bumps 970 is increased, so that the reliability of the connection structure and the redistribution layer is greatly improved. As shown in FIG. 10, the joints 960A are in direct contact with the conductive bumps 970, and the conductive bump 970 seats on the metallic plug portion 931 with the stud portions 950 rooted in the conductive bumps 970.

In the above-mentioned embodiments, the joints are formed with protruded stud portions for receiving the conductive elements, better connection reliability can be achieved. As such, peeling or delamination between the connection structures can be reduced and reliability of the connection structures can be improved.

In accordance with some embodiments of the present disclosure, a package structure including a semiconductor die, a molding compound, a redistribution layer and conductive balls is provided. The molding compound encapsulates the semiconductor die. The redistribution layer is disposed on the molding compound and over the semiconductor die and is electrically connected to the semiconductor die. The conductive balls are disposed on a first surface of the redistribution layer and are electrically connected to the semiconductor die. The redistribution layer includes joints. At least one joint of the joints includes a pad portion and a ridge portion surrounding the pad portion. The conductive ball is in contact with the ridge portion protruding from the first surface of the redistribution layer.

In accordance with another embodiment of the present disclosure, a package structure including a semiconductor die, a molding compound, a redistribution layer and conductive balls is provided. The redistribution layer is disposed over the semiconductor die and is electrically connected to the semiconductor die. The redistribution layer has a first surface and a second surface opposite to the first surface. The molding compound is disposed on the first surface of the redistribution layer and encapsulates the semiconductor die. The conductive balls are disposed on the second surface of the redistribution layer and are electrically connected to the semiconductor die. The redistribution layer includes joints. At least one joint of the joints includes a pad portion, a plug portion disposed on the pad portion and a stud portion disposed on the plug portion. The conductive ball is in contact with the stud portion and the plug portion protruding from the second surface of the redistribution layer.

In accordance with yet another embodiment of the present disclosure, a method for forming a package structure is provided. A carrier having a first dielectric layer formed thereon is provided. A second dielectric layer having at least one opening is formed over the first dielectric layer. At least one block is formed over the carrier within the at least one opening. A first seed layer is formed over the second dielectric layer, the at least one opening and the at least one block. A metallic pattern is formed on the first seed layer and fills the at least one opening. The carrier is removed to expose the first dielectric layer. The first dielectric layer is removed to expose the metallic pattern. At least one conductive ball is formed on the exposed metallic pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a semiconductor die;
   a molding compound encapsulating the semiconductor die;
   a redistribution layer, disposed on the molding compound and over the semiconductor die and being electrically connected to the semiconductor die; and conductive balls, disposed on a first surface of the redistribution layer and being electrically connected to the semiconductor die, wherein the redistribution layer includes joints, at least one joint of the joints includes a pad portion, a ridge portion surrounding the pad portion, a metallic block located on the pad portion and inlaid in the ridge portion and a seed layer sandwiched between the metallic block, the pad portion and the ridge portion, and the conductive ball is in contact with the ridge portion protruding from the first surface of the redistribution layer.

2. The package structure according to claim 1, wherein the at least one joint further comprises a first seed layer located between the at least one joint and the first surface of the redistribution layer.

3. The package structure according to claim 2, wherein the conductive ball is in direct contact with the pad portion without the first seed layer located in-between.

4. The package structure according to claim 1, wherein the conductive ball is in contact with the ridge portion and the metallic block.

5. The package structure according to claim 4, wherein a material of the metallic block includes copper, nickel, tungsten, titanium, silver, aluminum, gold or alloys thereof.

6. The package structure according to claim 4, wherein the ridge portion and the metallic block are protruded from the first surface of the redistribution layer with a same height.

7. The package structure according to claim 2, wherein a material of the first seed layer is the same as a material of the seed layer.

8. The package structure according to claim 1, wherein the conductive balls include solder balls or ball grid array (BGA) balls, and the joints are ball pads comprising copper or copper alloys.

9. A package structure, comprising:
a semiconductor die;
a redistribution layer, disposed over the semiconductor die and being electrically connected to the semiconductor die, wherein the redistribution layer has a first surface and a second surface opposite to the first surface;
a molding compound, disposed on the first surface of the redistribution layer and encapsulating the semiconductor die; and
conductive balls, disposed on the second surface of the redistribution layer and being electrically connected to the semiconductor die, wherein the redistribution layer includes joints, at least one joint of the joints includes a pad portion, a plug portion disposed on the pad portion, a dielectric layer, a seed layer and a stud portion disposed on the plug portion, the conductive ball is in contact with the stud portion and the plug portion protruding from the second surface of the redistribution layer, the dielectric layer covers a portion of the pad portion and a sidewall of the plug portion, and the pad portion is spaced apart from the dielectric layer by the seed layer.

10. The package structure according to claim 9, wherein the plug portion is spaced apart from the dielectric layer.

11. The package structure according to claim 10, wherein the conductive ball is in direct contact with the stud portion and the plug portion protruding from the second surface of the redistribution layer without the seed layer in-between.

12. The package structure according to claim 9, wherein the stud portion and the plug portion are protruded from the second surface of the redistribution layer with a first height, and the first height is about 2%~20% of a height of the conductive ball.

13. The package structure according to claim 9, wherein materials of the stud portion, the plug portion and the pad portion are the same.

14. The package structure according to claim 9, wherein the conductive balls include solder balls or ball grid array (BGA) balls, and the joints are ball pads comprising copper or copper alloys.

* * * * *